US007228239B1

(12) United States Patent
Cetto

(10) Patent No.: US 7,228,239 B1
(45) Date of Patent: Jun. 5, 2007

(54) METHODS AND SYSTEMS FOR CLASSIFYING MASS SPECTRA

(75) Inventor: Lucio Cetto, Boston, MA (US)

(73) Assignee: The Mathworks, Inc., Natick, MA (US)

( * ) Notice: Subject to any disclaimer, the term of this patent is extended or adjusted under 35 U.S.C. 154(b) by 223 days.

(21) Appl. No.: 11/021,910

(22) Filed: Dec. 22, 2004

(51) Int. Cl.
*G03F 19/00* (2006.01)

(52) U.S. Cl. ........................................ 702/30; 436/171

(58) Field of Classification Search .................. 702/30, 702/182–185, 76, 22, 27; 436/171, 173
See application file for complete search history.

(56) References Cited

U.S. PATENT DOCUMENTS

2004/0245455 A1* 12/2004 Reinhold .................... 250/288
2005/0143928 A1* 6/2005 Moser et al. ................. 702/19

* cited by examiner

*Primary Examiner*—Edward Raymond
(74) *Attorney, Agent, or Firm*—Lahive & Cockfield, LLP

(57) ABSTRACT

Methods and systems are disclosed for classifying mass spectra to discriminate the absence or existence of a condition. The mass spectra may include raw mass spectrum intensity signals or may include intensity signals that have been preprocessed. The method and systems include determining a first or higher order derivative of the signals of the mass spectra, or any linear combination of the signal and a derivative of the signal, to form a mass spectra data set for training a classifier. The mass spectra data set is provided as input to train a classifier, such as a linear discrimination classifier. The classifier trained with the derivative-based mass spectra data set then classifies mass spectra samples to improve discriminating between the absence or existence of a condition.

23 Claims, 27 Drawing Sheets

METHODS AND SYSTEMS FOR CLASSIFYING MASS SPECTRA

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention generally relates to methods and systems for classifying mass spectra.

BACKGROUND INFORMATION

Mass spectrometry is a powerful tool for determining the masses of molecules present in a sample. A mass spectrum consists of a set of mass-to-charge ratios, or m/z values and corresponding relative intensities that are a function of all ionized molecules present in a sample with that mass-to-charge ratio. The m/z value defines how a particle will respond to an electric or magnetic field that can be calculated by dividing the mass of a particle by its charge. A mass-to-charge ratio is expressed by the dimensionless quantity m/z where m is the molecular weight, or mass number, and z is the elementary charge, or charge number. Mass spectrometry provides information on the mass to charge ratio of a molecular species in a measured sample. The mass spectrum observed for a sample is thus a function of the molecules present. Conditions that affect the molecular composition of a sample should therefore affect its mass spectrum. As such, mass spectrometry is often used to test for the presence or absence of one or more molecules. The presence of such molecules may indicate a particular condition such as a disease state or cell type. A "marker" refers to an identifiable feature in mass spectrum data that differentiates the biological status, such as a disease, represented by one data set of mass spectra from another data set. A marker can differentiate between a person with a specific disease versus a person not having that disease. In some cases, differences in peaks in the mass spectra may be used as differentiating feature to form one or more markers. One way to determine markers for a disease is by determining if the mass spectra of biological samples from patients with the disease are differentially expressed from mass spectra of samples from patients not having the disease. By comparing mass spectra obtained from blood, serum, tissue or some other source, of patients with a disease against mass spectra from healthy patients, clinicians hope to be able to identify markers for disease and create diagnostic tools that can be used to detect or confirm the presences of a disease.

Manual inspection of mass spectra may be feasible for a small number of mass spectra samples. However, manual inspection is not feasible for larger quantities of mass spectra data sets. Advances in mass spectrometry technology allow for higher throughput screening of mass spectra samples. Recently, a number of algorithms haven been developed to find differences in mass spectra data to differentiate between mass spectra data of samples taken from two separate conditions. These algorithms that discriminate one condition from another by comparing spectral differences are called mass spectrometry classification algorithms, or classifiers. For example, one mass spectra data set may be a control mass spectra data set with a known marker or markers for identifying a certain disease state. The other mass spectra data set may be a sample that has not been classified. The algorithm of the classifier may be used to compare the mass spectra data sample to determine if it has any of the markers from the control data set, and therefore may be used to classify the sample as having the disease state. There are various types of classifiers applying different algorithms to these types of problems, including Classification and Regression Trees (CART), artificial neural networks, and linear discriminant analyzers.

The accuracy and running-time of classifiers in discriminating between separate conditions is impacted by the quality and preparation of the mass spectra data. Spectra obtained from mass spectrometry machines are noisy signals that contain many peaks that may correspond to markers. More expensive machines can produce less noisy data. However, differences in peaks are not guaranteed to differentiate between two conditions. Furthermore, these may be differentiating signals which are not differentially expressed due to the noisy signals or otherwise not easily differentiated in the patterns of the mass spectra data. For example, subsequent smaller peaks may not be emphasized because of the smearing effect of data patterns of larger peaks.

Identifying markers is an important step in discriminating between two conditions, such as in the diagnostics of diseases. Classifiers can be time-consuming and expensive to run in identifying markers, especially when working with raw mass spectrum intensity signals with unknown markers. Furthermore, it is not readily apparent what characteristics of mass spectra data patterns may represent a potential marker. Therefore, improved methods and systems are desired to improve the accuracy of classifiers and to provide better classification of mass spectra.

SUMMARY OF THE INVENTION

The present invention provides methods and systems for improving the classification of mass spectra data by training a classifier with derivatives of the mass spectrum intensity signal values or with mass spectrum intensity signals passed through a high-pass filter. Raw or preprocessed mass spectrum intensity signals are obtained to form a first mass spectra data set. Then one or more derivative algorithms are performed on the first mass spectra data set to from a second mass spectra data set for training a classifier. The derivative algorithms may include a first order derivative, or any second or higher order derivative of the spectrum signal values of the first mass spectra data set. The derivative algorithm may also include any linear combination of these derivatives and the mass spectrum intensity values. Additionally, the mass spectrum signals, or any derivatives thereof, can be passed through a high pass filter to form the second data set for training. The derivative and/or high-pass filtered version of the mass spectrum intensity signals may emphasize, or otherwise show interesting characteristics of the mass spectra data patterns that may provide potential markers. Classifiers trained using these techniques are found to be more specific, sensitive, and accurate. This can reduce the time and cost of identifying novel markers and classifying mass spectra samples according to these markers.

In one aspect, the present invention relates to a method performed in an electronic device for classifying mass spectra using mathematical differentiation techniques. The method performs a mathematical differentiation on mass spectrum signals of a first data set to form a second data set. As such, the second data set includes one or more mathematical derivatives of mass spectrum signals of the first data set. The method then provides the second data set to train a classifier to form a classification model for mass spectrometry classification. In a further aspect, the method forms the classification model from the second data set by invoking an execution of a classifier to train with the second data set. The classifier may be any type of classifier such as a linear discriminant analysis classifier or a nearest neighbor classifier.

In another aspect, the method performs mathematical differentiation on the first data set by taking a first order, or a second or higher order mathematical derivative of one or more mass spectrum signals. Additionally, mathematical differentiation may include performing a linear combination of a mass spectrum signal and any order derivative of the mass spectrum signal. Mathematical differentiation may be performed by invoking execution of one or more executable instructions in a technical computing environment.

In an additional aspect, the method invokes an execution of a classifier to classify a sample data set of mass spectrum signals using the classification model or otherwise trained with the second data set. The classifier may be invoked by calling a classifier function in a technical computing environment. The sample data set of mass spectra data may include one or more mathematical derivatives of mass spectrum signals from the sample. The mathematical derivative is determined on the mass spectra sample data by taking a first order derivative, or a second or high order derivative of one or more of the mass spectrum signals.

In one aspect, the first data set or portion of the first data set may include raw mass spectrum intensity signals. The first data set or a portion of the first data set may also include processed mass spectrum intensity signals. The processed mass spectrum intensity signals may have been normalized, smoothed, case corrected, baseline corrected, or peak aligned to form the first data set.

In another aspect, the present invention relates to a device readable medium having device readable instructions to execute the steps of the method, as described above, related to a method for classifying mass spectra using mathematical differentiation techniques. In a further aspect, the present invention relates to transmitting computer data signals via a transmission medium having device readable instructions to execute the steps of the method, as described above, related to a method for classifying mass spectra using mathematical differentiation techniques.

In one aspect, the present invention relates to a method performed in an electronic device for classifying mass spectra using high pass filtering techniques. The method filters one or more mass spectrum signals of a first data set of mass spectrum signals to form a second data set. The method then provides the second data set to train a classifier to form a classification model for mass spectrometry classification. In a further aspect, the method forms the classification model from the second data set by invoking an execution of a classifier to train with the second data set. The classifier may be any type of classifier such as a linear discriminant analysis classifier or a nearest neighbor classifier. Additionally, the high-pass filtering may be performed by invoking execution of one or more executable instructions in a technical computing environment.

In an additional aspect, the method invokes an execution of a classifier to classify a sample data set of mass spectrum signals using the classification model or otherwise trained with the second data set. The classifier may be invoked by calling a classifier function in a technical computing environment. The sample data set of mass spectra data may include one or more mass spectrum signals from the sample passed through a high-pass filter. In a further aspect, either the first data set or the second data set may include mathematical derivatives of one or more of the mass spectrum signals.

In one aspect, the first data set or portion of the first data set may include raw mass spectrum intensity signals. The first data set or a portion of the first data set may also include processed mass spectrum intensity signals. The processed mass spectrum intensity signals may have been normalized, smoothed, case corrected, baseline corrected, or peak aligned to form the first data set.

In another aspect, the present invention relates to a device readable medium having device readable instructions to execute the steps of the method, as described above, related to a method for classifying mass spectra using high-pass filtering techniques. In a further aspect, the present invention relates to transmitting computer data signals via a transmission medium having device readable instructions to execute the steps of the method, as described above, related to a method for classifying mass spectra using high-pass filtering techniques.

In one aspect, the present invention relates to a system for classifying mass spectra. The system has a computing environment, such as a technical computing environment, that receives a first data set having mass spectrum signals. The computing environment obtains and executes one or more executable instructions to perform either mathematical differentiation or high-pass filtering on the first data set to form a second data set. The computing environment provides the second data set to a classifier for training to form a classification model for classifying mass spectra data samples. The executable instructions may be a program, or may represent or be written in a technical computing programming language.

In another aspect, the classification model is formed from the second data set by invoking a classifier to train with the second data set. The classifier may be implemented as a classifier function in the technical computing environment. Additionally, the computing environment and the classifier may be distributed, and each may run on a different computing device. Furthermore, the classifier may be any type of classifier such as a linear discriminant classifier and a nearest neighbor classifier. In one aspect, an execution of a classifier function is invoked to classify a sample data set of mass spectrum signals using the classification model.

In a further aspect, performing mathematical differentiation of mass spectrum signals includes taking a first order derivative, second or higher order derivative, or any linear combination of these derivatives and the mass spectrum signals. Additionally, the second data set for training the classifier may be formed by filtering the mass spectrum signals of the first data set with a high-pass filter. The first data set may include raw mass spectrum intensity signals. Alternatively, the first data set may also include processed mass spectrum intensity signals. The mass spectrum signals of the first data set may have been processed by normalizing, smoothing, case correcting, baseline correcting, or peak aligning the mass spectrum signals.

The details of various embodiments of the invention are set forth in the accompanying drawings and the description below.

BRIEF DESCRIPTION OF THE DRAWINGS

The foregoing and other objects, aspects, features, and advantages of the invention will become more apparent and may be better understood by referring to the following description taken in conjunction with the accompanying drawings, in which.

DETAILED DESCRIPTION

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides for the improved classification of mass spectra data. Methods and systems are described for improving the classification of mass spectra data to discriminate the absence or existence of a condition. The mass spectra data may include raw intensity signals or may include intensity signals that have been normalized, smoothed, peak-aligned or otherwise corrected or adjusted. The methods and systems of the illustrative embodiment of the present invention perform the additional processing step of determining a first or higher order derivative of the signals of the mass spectra, or any linear combination of the signal and a derivative of the signal, to form a training data set. Alternatively, the methods and systems of the illustrative embodiment of the present invention may perform high-pass filtering on the mass spectrum signals to form the training data set. The training data set is provided as input to train a classification system, or classifier, such as a linear discrimination classifier. The classifier trained with the derivative-based training data set then classifies mass spectra samples to discriminate the absence or existence of a condition. Classifiers using the derivative data techniques described herein provide an improved classification system, and have been found to be more specific, sensitive, and accurate.

The illustrative embodiment will be described solely for illustrative purposes relative to the technical computing environment of MATLAB® from The MathWorks, Inc. of Natick, Mass. Although the illustrative embodiment will be described relative to a MATLAB® based application, one of ordinary skill in the art will appreciate that the present invention may be applied to other technical computing environments, such as any technical computing environments using software products of LabVIEW®, MATRIXx from National Instruments, Inc., Mathematica® from Wolfram Research, Inc., Mathcad of Mathsoft Engineering & Education Inc., or Maple™ from Maplesoft, a division of Waterloo Maple Inc.

Figure 1:
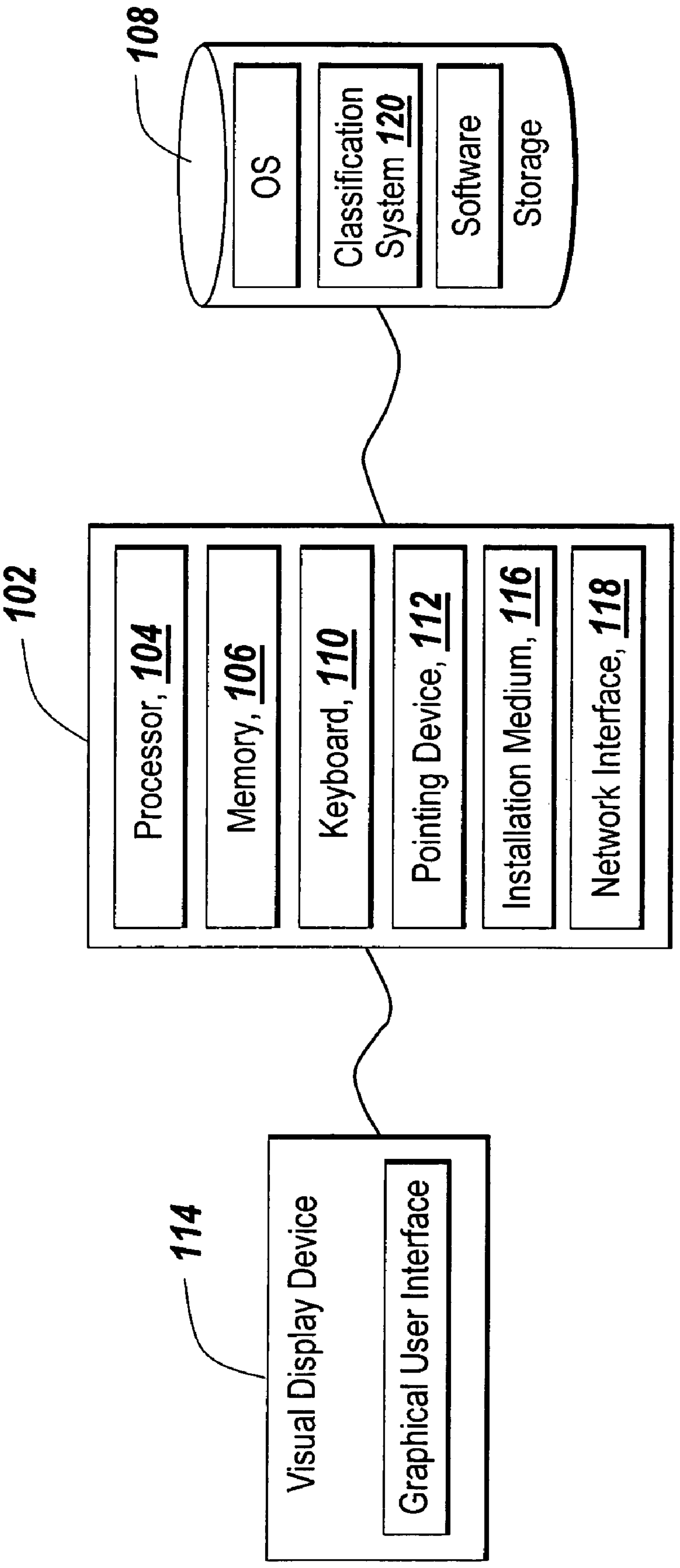
FIG. 1 is a block diagram of a computing device for practicing an illustrative embodiment of the present invention.

FIG. 1 depicts an environment suitable for practicing an illustrative embodiment of the present invention. The environment includes a computing device 102 having memory 106, on which software according to one embodiment of the present invention may be stored, a processor (CPU) 104 for executing software stored in the memory 106, and other programs for controlling system hardware. The memory 106 may comprise a computer system memory or random access memory such as DRAM, SRAM, EDO RAM, etc. The memory 106 may comprise other types of memory as well, or combinations thereof. A human user may interact with the computing device 102 through a visual display device 114 such as a computer monitor, which may include a graphical user interface (GUI). The computing device 102 may include other I/O devices such a keyboard 110 and a pointing device 112, for example a mouse, for receiving input from a user. Optionally, the keyboard 110 and the pointing device 112 may be connected to the visual display device 114. The computing device 102 may include other suitable conventional I/O peripherals. The computing device 102 may support any suitable installation medium 116, a CD-ROM, floppy disks, tape device, USB device, hard-drive or any other device suitable for installing software programs such as the classification system 120 of the present invention. The computing device 102 may further comprise a storage device 108, such as a hard-drive or CD-ROM, for storing an operating system and other related software, and for storing application software programs such as the classification system 120 of the present invention. Additionally, the operating system and the classification system 120 can be run from a bootable CD, such as, for example, KNOPPIX®, a bootable CD for GNU/Linux.

The computing device 102 may include a network interface 118 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. The network interface 118 may comprise a built-in network adapter, network interface card, PCMCIA network card, card bus network adapter, wireless network adapter, USB network adapter, modem or any other device suitable for interfacing the computing device 118 to any type of network capable of communication and performing the operations described herein. Moreover, the computing device 102 may be any computer system such as a workstation, desktop computer, server, laptop, handheld computer or other form of computing or telecommunications device that is capable of communication and that has sufficient processor power and memory capacity to perform the operations described herein.

Figure 2A:
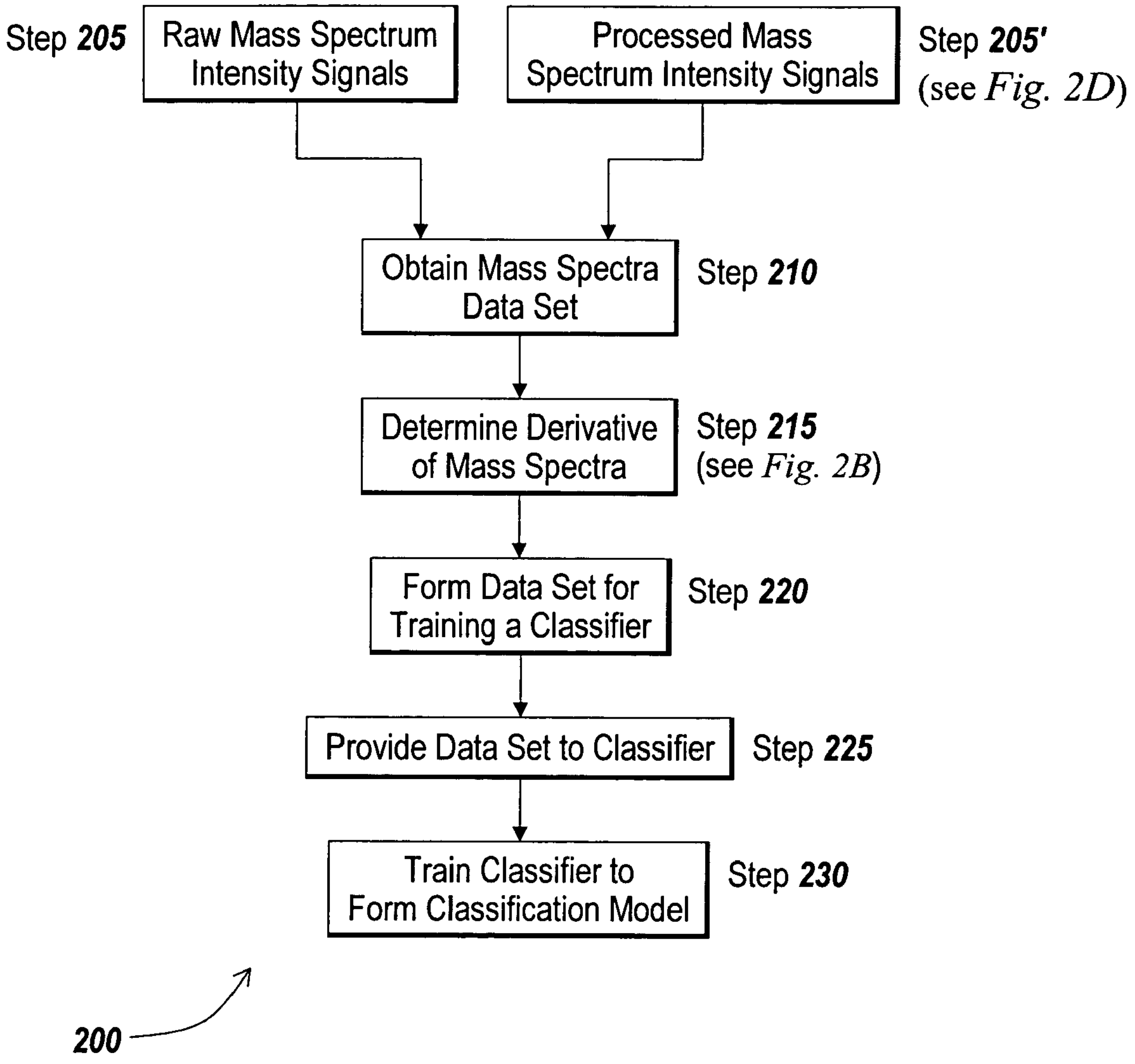
FIG. 2A is a flow diagram of steps followed for practicing an illustrative embodiment of training a mass spectra classifier in accordance with the present invention.

In one aspect, the present invention provides a method for training a classifier to form a classification model. Referring now to FIG. 2A, an illustrative method of training a classifier using the techniques of the present invention is depicted. At step 210 of the method, a first mass spectra data set is obtained, received, or otherwise formed from a set of raw mass spectrum intensity signals at step 205, or processed mass spectrum signals at step 205', or any combination thereof. In one embodiment at step 205, the first mass spectra data set comprises one or more raw mass spectrum intensity signals obtained by any suitable process or mechanism. For example, the raw mass spectrum intensity signals may have been generated by any type of mass spectrometry equipment, such as a gas phase ion spectrometry, an ion mobility spectrometry, a laser desorption time-of-flight mass spectrometry, Fourier transform type spectrometry, or a tandem spectrometry. Furthermore, the mass spectrometry equipment providing the mass spectrum intensity signal may use any suitable ionization techniques. In an additional example, the raw mass spectrum intensity signals may be obtained from a mass spectrometry using, for example, electron ionization, matrix-assisted laser desorption ionization (MALDI), surface enhanced laser desorption ionization (SELDI), electrospray ionization, atmospheric pressure chemical Ionization (APcI), thermal ionization (TIMS), secondary ionization (SIMS), fast atom bombardment, or using a plasma ion source. Raw mass spectrum intensity signals used herein may be a result of, obtained by, or otherwise generated from any type of mass spectrometry equipment device capable of producing a mass spectrum sample to determine its composition using any type of ionization process to produce such mass spectrum. Furthermore, although mass spectra is generally discussed herein in terms of mass-to-charge ratios or M/Z values, one ordinarily skilled in the art will appreciate that time-of-flight values or other values derived from time-of-flight values may be used in classification systems and methods, such as those described in the present invention.

Figure 2B:
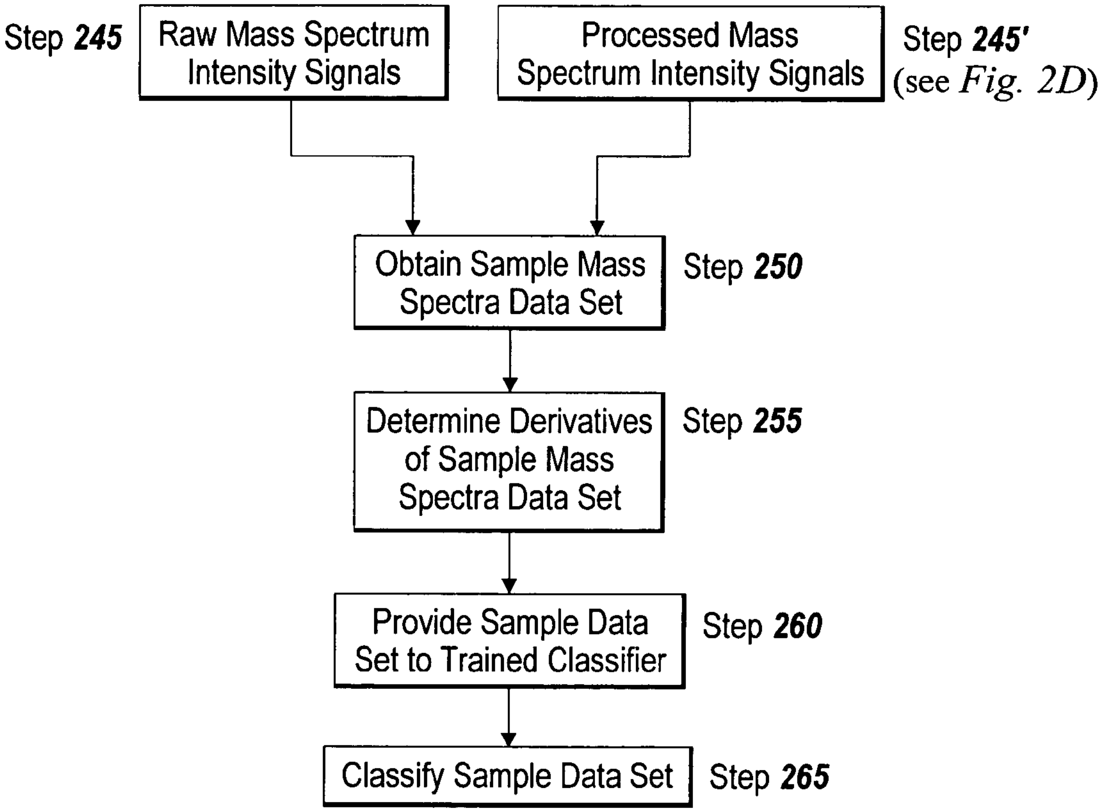
FIG. 2B is a flow diagram of steps followed for practicing an illustrative embodiment of classifying mass spectra in accordance with the present invention.

In the alternative step 205' of the method, one or more mass spectrum intensity signals may be preprocessed to form the first mass spectra data set at step 210 for training a classifier. For example, the raw mass spectrum intensity signals of step 205 may be processed by a computing device 102 to form a mass spectra data set for step 210. Any type of processing may be performed on the mass spectrum intensity signals, such as baseline correcting, case correcting, normalizing, smoothing, and peak aligning. Processed mass spectrum signals to form a mass spectra data set at step 210 may also be referred to as pre-processed mass spectra data. It is referred to as pre-processed as it is processed before or prior to going through the training and classification process of the present invention, or otherwise prior to forming the mass spectra data set at step 210. FIG. 2D shows various steps of an illustrative method of preprocessing mass spectra data at step 205'.

In the case of baseline correcting mass spectrum signals as shown at step 205A in the illustrative preprocessing methods of FIG. 2D, a constant value may be subtracted from one or more of the mass spectrum signals. At low mass-to-charge ratios or intensity values, a significant amount of noise may be generated due to the mass spectrometry equipment or the ionization process used by the equipment. Noise can be more likely at lower mass-to-charge ratios than at higher mass-to-charge ratios. A baseline calculation adjusts the mass spectra to take into account the presence of the noise signal. For example, the lower range of intensity values of the mass spectrum signals may never be close to zero and the signals maybe adjusted accordingly to form a baseline where the mass spectrum signals have a lower range intensity value starting at or near zero. By one example, a baseline correction may comprise a simple offset correction of subtracting a y value from each point of the spectrum. In another example, a baseline correction may comprise a two-point baseline correction where a connecting line between two selected points form a trace that is subtracted from the mass spectrum signals. In this manner, the baseline may be calculated using a standard linear equation. In a similar manner, a multi-point baseline may be performed by connecting multiple selected points and subtracting the resulting trace from the mass spectrum signals. In another example of a baseline correction technique, an interactive polynomial baseline is performed where a cubic polynomial function is fitted to the curve of the waveform representing the mass spectrum signals. In one embodiment, the baseline of a set of mass spectrum intensity signals may be corrected using a windowed piecewise cubic interpolation method. One ordinarily skilled in the art will appreciate the various methods and techniques for baseline correcting one or more data sets such as those comprising mass spectrum intensity signals.

In another example of preprocessing, the data set of mass spectrum intensity signals may be normalized as depicted by step 205*b* in the illustrative preprocessing method of FIG. 2D. Normalization is a process whereby the value of each signal is re-calculated relative to some reference value. For example, a data set may comprise an aggregation of multiple data sets. In some of these case, the data has to be normalized so that the all datasets have the same m/z values. In yet another example, a standard mass spectrum data set may be provided as a reference for normalizing data generated by specific type or instance of mass spectrometry equipment. One or more signals from the standard set can be used as a reference to normalize the mass spectrum signals processed at step 205'. In this manner, samples from this mass spectrometry equipment may be calibrated, or otherwise adjusted to have the samples take into any account any differences due to the equipment. In a further example, the signals in the mass spectra may be normalized by taking the log values of the signal intensities. One ordinarily skilled in the art will recognize the various methods to normalize one or more data sets of mass spectrum intensity signals.

As depicted by step 205*c* of the illustrative preprocessing method of FIG. 2D, the mass spectra may also be preprocessed by smoothing out the mass spectrum signals to take into account any signal noise. By applying a smoothing algorithm, features or data patters of interest of the mass spectra data may be exposed or emphasize. These features may have not been recognized prior to smoothing because of the noisy signals. The smoothing process results in a smoothed value that may be a better estimate of the original value because the noise has been reduced. There are common types of smoothing methods such as filtering (averaging) and local regression. By way of example, these smoothing methods require a span, which defines a window of neighboring points to include in the smoothing calculation for each data point. This window moves across the data set as the smoothed value is calculated for each data point. A large span increases the smoothness but decreases the resolution of the smoothed data set, while a small span decreases the smoothness but increases the resolution of the smoothed data set. An optimal span value depends on your data set and the smoothing method. By further example of types of smoothing algorithms, the Curve Fitting Toolbox of MATLAB® supports the smoothing methods of moving average filtering, lowess and loess filtering, and Savitsky-Golay filtering. One ordinarily skilled in the art will recognize the various types and techniques for smoothing a data set such as any of the mass spectra data sets of the present invention.

Additionally, at step 205*n* of the illustrative method of FIG. 2D, the mass spectra data may be case corrected in any suitable manner before being used to form the mass spectra data set at step 210 to train a classifier. For example, outliers, such as data not fitting a statistical distribution model, may be removed from the data set. In another example, signals which are less likely to produce interesting features or otherwise less likely to impact classification may be removed. In another example, signals with low intensity values may be removed. On a case by case basis, one or more data points of the mass spectra data may be removed, changed, or adjusted in a suitable manner to form the mass spectra data at step 210. This may be done on a case by case basis from knowledge or prior experience related to the specific mass spectra data set to be formed for training. One ordinarily skilled in the art will appreciate how the mass spectra data may be corrected in order to facilitate and improve the classification of the data.

Although preprocessing is discussed generally in terms of baseline and case correction, normalization, and smoothing, any other form of preprocessing may occur that otherwise processes a set of mass spectrum intensity signals to form a mass spectra data set for classification purposes. Additionally, one, some or all of these preprocessing steps 205*a*–205*n* may be performed on all or a portion of the mass spectra data set and may be performed in any or different orders. For example, a data set may first be normalized at step 205*b*, then baseline corrected at step 205*a*, then smoothed or case corrected at either step 205*c* or step 205*n* respectively. In another case, the mass spectra data may be baseline corrected at step 205*a* and then case corrected at step 205*n*. Furthermore, although steps 205 and 205' are discussed in the alternative, at step 210 the raw mass spectrum signals of step 205 may be obtained and preprocessed in order to form a mass spectra data set as a classification training set. Also, the processed mass spectrum intensity signals of step 205' may be further preprocessed at step 210. For example, the processed mass spectrum intensity signals may only be normalized at step 205' and at step 210 they may be further preprocessed by performing a case or baseline correction.

One ordinarily skilled in the art will appreciate the various types and forms of preprocessing that may occur to the data in order to facilitate and improve the classification process.

Additionally, although discussed in terms of a single mass spectra data set, the mass spectra may be aggregated or otherwise obtained from multiple mass spectra data sets, multiple sources, either raw or preprocessed, or may include other types of data. For example, a mass spectra data set comprising known distinguishing features or markers may be included to improve the classification process. In other cases, additional data not comprising mass spectrum intensity signals may be included for training a classifier or as discussed further below, in classifying mass spectra signals. For example, data identifying any biological information related to the source of the data, such as sex, gender, etc. may be provided. One ordinarily skilled in the art will recognize that other data besides mass spectrum intensity signals may be suitable and useful to consider for classification in practicing the present invention.

The raw mass spectrum intensity signals of step 205 and/or the preprocessed mass spectrum intensity signals of step 205' may be stored in, retrieved or otherwise obtained from any type of computing device 102 either locally, remote, on the Internet, or otherwise available by any suitable communication means, device readable medium, or transmission medium. The first mass spectra data set formed at step 210, or the mass spectrum data of steps 205 and 205' may be available in a database accessible via the Internet and may take the form of a computer readable file. By way of example, there are a number of datasets available over the Internet in the FDA-NCI Clinical Proteomics Program Databank at the web-site of the National Cancer Institute's Center of Cancer Research. For example, the FDA-NCI Clinical Proteomics Program Databank provides the Ovarian Dataset 8-8-02, which includes 91 controls and 162 ovarian cancers that were generated using the WCX2 protein array. These files are available in a comma separated format. In a further example, the raw mass spectrum intensity signals may be available from a computing device 102 embedded in the mass spectrometry equipment, or otherwise in communication with the mass spectrometry equipment. Additionally, the mass spectrometry equipment may have performed one or more preprocessing steps to the raw mass spectrum intensity signals measured for a particular sample or samples. One ordinarily skilled in the art will appreciate that the raw and/or preprocessed mass spectrum intensity signals may be obtained by any suitable means.

In one aspect, the present invention is directed towards the technique of performing an additional processing step on the raw or preprocessed mass spectrum signals to form input to train a classifier. In the illustrative method described below, the present invention performs mathematical differention on the mass spectrum signals as an additional step to form a training data set. In another illustration of an additional processing step, the mass spectrum signals are passed through a high-pass filter to form the training data set. At step 215 of the illustrative method of the present invention, one or more derivatives of the mass spectra data set obtained at step 210 is determined. Instead of providing a mass spectra data set comprising raw mass spectrum intensity signals and/or preprocessed mass spectrum intensity signals to train a classifier, the present invention performs the additional step of performing mathematical differentation such as by taking a first or higher order derivative of one or more mass spectrum signals in the data set. Derivatives can be used to determine the change which an item undergoes as a result of some other item changing with respect to a determined mathematical relationship between the two items. Derivatives can be represented as an infinitesimal change in a function with respect to any parameters it may have, and a function is differentiable at a data point if its derivative exists at this point. The derivative of a differentiable function can itself be differentiable. The derivative of a derivative is called a second derivative. Similarly, the derivative of a second derivative is a third derivative, and so on. In an example of mass spectrum signals, the derivative can be represented as a function of the mass spectrum intensity signal value, or as a function of any other parameter or variable that may have a differentiable relationship with the signal value. In one case, the derivative of a signal value may be expressed as a differential between its value and any other signal value in the mass spectra data set, such as the next adjacent signal value. Other derivative functions may be formed from relationships defined between the mass spectrum signal values and any other suitable data, such as mass spectrometry equipment parameters or biological data related to the source of the data. One ordinarily skilled in the art will appreciate the various forms and types of derivatives that may be performed on values in a data set such as one comprising mass spectrum intensity signal values.

Figure 2C:
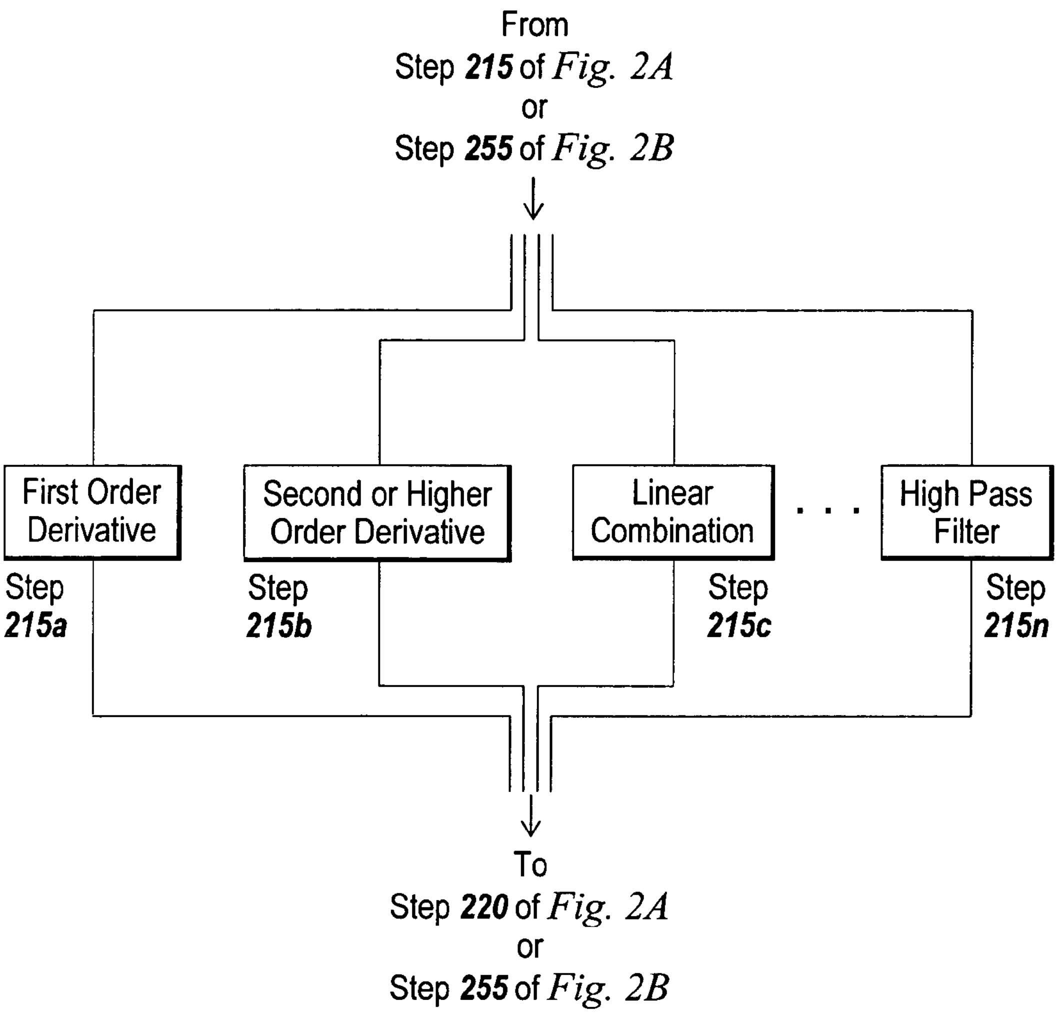
FIG. 2C is a flow diagram of steps followed for practicing an illustrative embodiment of processing techniques on mass spectra data for training a classifier or for classification mass spectra samples in accordance with the present invention.
Figure 2D:
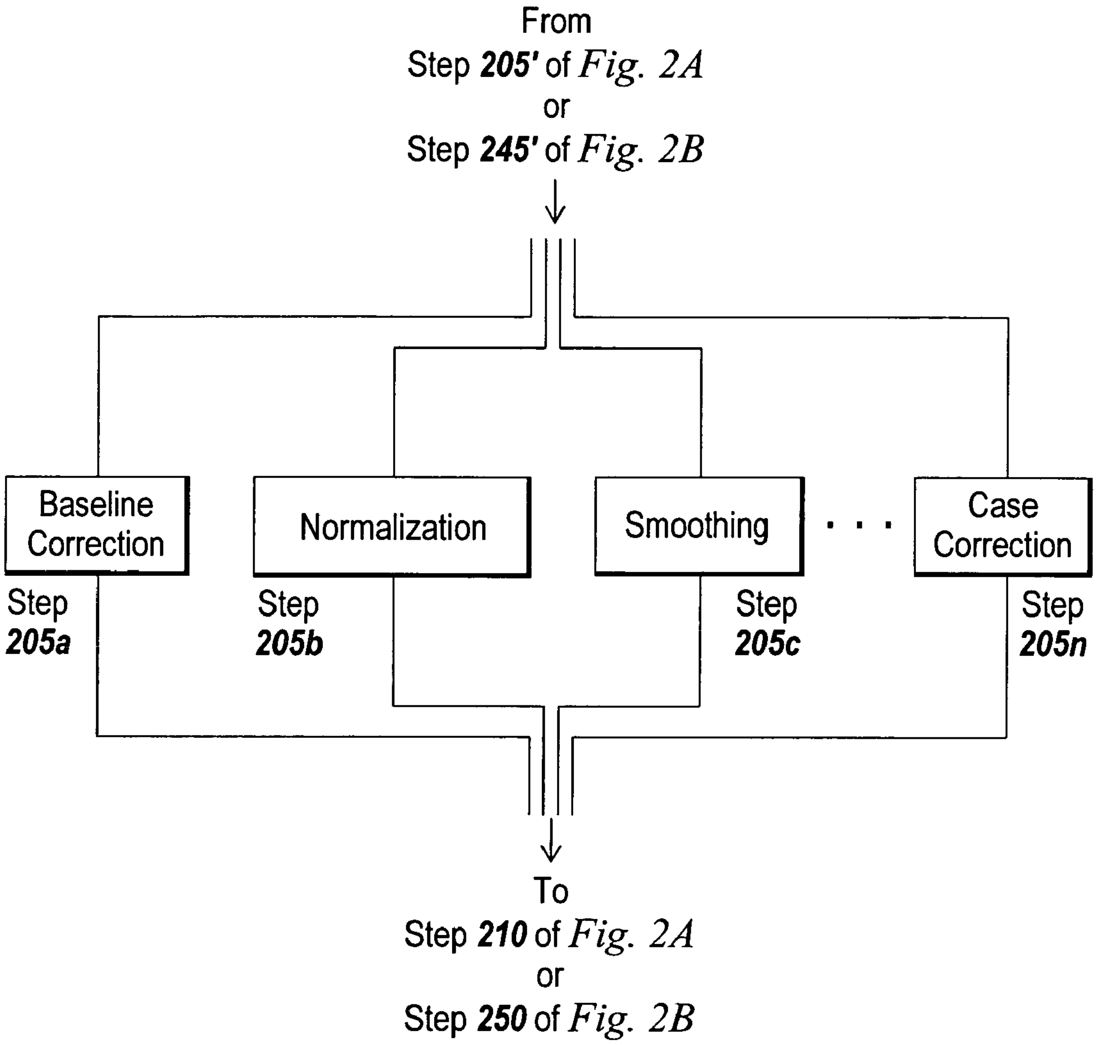
FIG. 2D is a flow diagram of steps followed for practicing an illustrative embodiment of preprocessing techniques on mass spectrum intensity signals of training or sample mass spectra data.

Referring now to FIG. 2C, there are many types of derivatives that may be performed on one or more of the mass spectrum intensity signals of the mass spectra data set in accordance with the present invention. In one embodiment at step 215*a* of FIG. 2C, a first order derivative may be calculated on a portion of or all of the mass spectrum signals of the mass spectra set to form a training mass spectra data set. In another embodiment in step 215*b*, a second or high order derivative may be calculated on one or more of the mass spectrum signals. In a further embodiment, the derivative taken on the mass spectra data set may comprise a linear combination of the mass spectrum intensity signal and any of the derivatives, alone or in combination, performed at steps 215*a* and 215*b*.

In another embodiment of processing the mass spectra data using the techniques of the present invention, high pass filtering is performed on the mass spectra data set at step 215*n*. High pass filtering may be performed on raw or preprocessed mass spectrum signals. As a high pass filter, mass spectrum intensity signals of the mass spectra data set obtained at step 210 of an intensity value greater than a threshold value may be passed through unaffected while signals below a threshold value may be blocked, removed, or attenuated. The high pass filtering may also be performed on any of the data sets resulting from performing any of the derivative of steps 215*a* through 215*c*. Additionally, the high pass filtering may be performed only on a portion of the mass spectra data such as those portions showing interesting features or that is known to provide potential markers. One ordinarily skilled in the art will appreciate applying a high pass filter mechanism to an obtained mass spectra data set to form a mass spectra data set for training the classifier, and that other forms of filters may be applied to achieve similar results.

At step 220 of the illustrative method of FIG. 2A, a data set to train the classifier is formed. The training data set may be formed from any derivates taken at steps 215*a*–215*n*. For example, the training data set may formed from the a set of raw mass spectra set obtained at step 210 and performed the derivatives of one or more of the signals, or a linear combination of the derivative and the signal as input to train the classifier. Additionally, either prior to or subsequent to forming the training mass spectra data set at step 220, only a portion or subset of the mass spectra data may be used that shows interesting features, or is known to provide potential markers. For example, a certain m/z range of mass spectrum signals may be supplied for training. Significant features may be determined in a variety of ways. One may have knowledge related to either the specific mass spectra data set to be formed for training or from experience in classifying mass spectra with respect to distinguishing significant features from insignificant features. These significant features may be extracted, or otherwise obtained from, the mass spectra data programmatically, for example, using a technical computing programming language such as MATLAB®. At step 225, the formed derivative-based training data set is provided to a classifier for training, and at step 230, the classifier is trained with the derivative-based training data set to form a classification model for classifying sample data. The classifier may be verified to determine how well it performed using the formed classification model against mass spectra samples have known conditions. Accordingly, a classifier may be further trained to improve the performance of the classifier and form an improved classification model. One ordinarily skilled in the art will appreciate that in the illustrative method of FIG. 2A, any steps and variations thereof, may be repeated one or more times to train a classifier to form a desired classification model.

In using a mass spectra training set comprising one or more derivatives of mass spectrum signals or passed through a high-pass filter provides a more sensitive and more accurate classification system. The derivatives and/or high-pass filtering of the signals tend to make more distinguishing or emphasize significant features that may otherwise not be distinguishable. Additionally, the derivative and/or high-pass filtered signals may attenuate or de-emphasize non-differentiating signals or patterns that may not form potential markers. For example, in cases where there is a smaller peak in close proximity or adjacent to a larger peak, taking the derivative of the mass spectra makes the smaller peak a more interesting feature that may provide a distinguishing feature for classification.

In another aspect, the present invention is directed towards classifying mass spectra signals with a classifier trained with the derivative-based mass spectra training set or the high-pass filtered mass spectra training set. Referring now to FIG. 2B, an illustrative method of classifying mass spectra data samples is depicted. At step 250 of the illustrative method, a sample mass spectra data set is obtained from raw mass spectrum intensity signals of step 245, processed mass spectrum intensity signals of step 245', or some or any combination thereof. As discussed above in conjunction with steps 205 and 210 of FIG. 2A, these mass spectrum signals can be obtained from a variety of different sources and be processed and/or combined in a variety of different ways. For example, the sample mass spectrum signals may be preprocessed by one or more of the preprocessing steps 205*a*–205*n* depicted in the illustrative method of FIG. 2D. Additionally, the sample mass spectrum intensity signals may be peak aligned to form the sample mass spectra data set at step 250. For example, the sample mass spectrum signals may follow the same or similar curves or patterns as the training mass spectra data set but may have an offset or misalignment. For example, the sample mass spectrum signals may be peak aligned with the training mass spectra set or a standard mass spectra data set associated with the sample or the training set.

In a preferred embodiment, the mass spectra data signals would either be unprocessed or preprocessed in the same or similar manner as the mass spectra data set formed for training the classifier and in the same or similar manner as other samples being classified. One ordinarily skilled in the art will appreciate in performing classification that the samples to be classified be performed under similar conditions to the training data that formed the classification model. This is to ensure that differences between the sample mass spectra data sets and the training mass spectra data set is due to differences in the sample themselves and not due to any differences in how they were processed. One ordinarily skilled in the art will further appreciate how mass spectra samples may be preprocessed prior to classification to obtain desired classification results.

At step 255 of the illustrative method of FIG. 2B, the present invention performs mathematical differentiation and/or high-pass filtering on the sample mass spectra data set obtained at step 250. In a similar manner as step 215 of FIG. 2B and in accordance with the illustrative method of FIG. 2C, this illustrative embodiment of the present invention performs any of the steps 215*a*–215*n* on one or more signals in the sample mass spectra data set. The sample mass spectra data set, at step 260, is provided to the classifier trained in accordance with the present invention. In this manner, the classifier trained with the derivative data techniques can classify mass spectra samples according to the classification model. The methods of classification described herein improve the time and cost of classifying samples. The derivative and high-pass filtering techniques described herein expose potential markers that may not otherwise be distinguishable or differentiable. This may allow the training and sample mass spectra data sets to be reduced in size to focus on significant features that may form potential markers, thereby reducing the classification processing time to classify mass spectra samples.

Figure 3A:
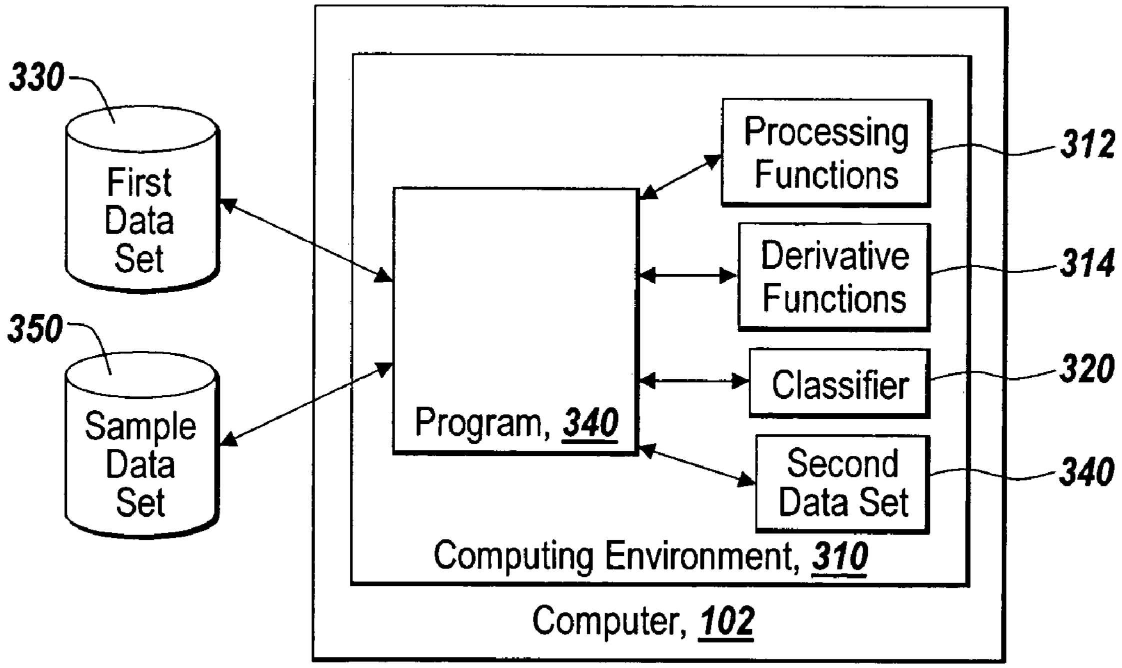
FIG. 3A is a block diagram of an illustrative embodiment of components of a system for practicing the present invention.

In another aspect, the present invention is directed towards a system for practicing the classification techniques described in connection with FIGS. 2A–2C. Referring now to FIG. 3A, an illustrative environment for practicing the present invention is illustrated. In broad overview, a computing environment 310 runs on a computer 102 and is capable of processing mass spectra data signals and performing the classification techniques of the present invention. The computer 102 may be any type of computing device as described above. The computing environment 310 may be any type of computing environment configured to and capable of performing the operations described herein. For example, the computing environment 310 may be the technical computing environment provided by MATLAB®. The computing environment 310 may comprise an environment for running a program 340. The program 340 may comprise one or more executable instructions to perform programmatically one or more of the methods of the classifying techniques described in conjunction with FIGS. 2A–2C. In an exemplary embodiment, the program 340 comprises instructions in the MATLAB® technical computing programming language, and the computing environment 310 is a MATLAB® technical computing environment that provides run-time environment for interpreting and executing the program 340. Although generally discussed as a program 340, the present invention can be practiced with any form of executable instructions, alone or in combination, such as an executable file, script, interpretative language programming listing, functions, procedures, object code, library, or any other form of executable instructions capable of performing the operations described herein.

The program 340 may have access to processing functions 312 in order to process the mass spectra data and perform any other suitable instructions, such as high-pass filtering. The program 340 may also have access to derivative functions 314 to perform any of the methods of taking derivatives of mass spectrum signals as described in conjunction with FIGS. 2A–2C. The processing functions 312 and the derivative functions 314 may be in any suitable form such as built-in statements of the programming language of the program 340, or one or more libraries accessible by either the program 340 or the computing environment 310, or in any other form of executable instructions. For example, portions of the processing functions 312 may be provided by the programming language of MATLAB® and portions of the derivative functions may be provided by one or more MATLAB® toolboxes accessible by a computing environment 310 such as MATLAB®. Although generally referred to as functions, they may be subroutines, procedures, programming language statements or any other form of executable computer or programming instructions. One ordinarily skilled in the art will appreciate the various forms the processing functions 312 and derivative functions 314 may take in practicing an embodiment of the present invention.

The processing functions 312 can be used to obtain, process, and provide any of the mass spectra data sets used in practicing the present invention. The first mass spectra data set 330 of FIG. 3A is obtained by the program 340 to process and apply the preprocessing and derivative techniques of the present invention to form a second mass spectra data set 340 to train a classifier 320. The first mass spectra data set 330 may comprise one or more mass spectra data sets 330 in any format readable or otherwise suitable to use by the program 340 or the computing environment 310. In some embodiments, the first mass spectra data set 330 of FIG. 3A may comprise one or more of the datasets available from the Clinical Proteomics Program Databank. One embodiment of the present invention will be illustrated using the Ovarian Dataset 8-7-02 from the FDA-NCI Clinical Proteomics Program Databank as the first mass spectra data set 330. This first mass spectra 330 may be stored on the computer 102 of FIG. 3A and may have downloaded or otherwise obtained from another computing device, e.g. a web site, or a device readable medium. The Ovarian Dataset 8-7-02 forming the first mass spectra data set 330 may be a compressed file and in a comma separated file format. After downloading and uncompressing the file, the data from the file is stored in comma separated value files in two directories. One directory is the 'Control' directory for holding the control mass spectra data set for training the classifier 320, and an 'Ovarian Cancer' directory for holding one or more sample data files to form the sample data set 350. Each file contains two columns, the m/z values, and the intensity values corresponding to the mass/charge ratios. The following example of a program 340, or set of executable instructions, in the programming language of MATLABO® that shows the use of processing functions 312 to load or import the first mass spectra data set 330 and plot the mass spectra data 330 in a graphical format:

```
close all force; clear all;
cd Control
daf_0181=importdata('Control daf–0181.csv')
daf_0181=
data: [15154×2 double]
textdata: {'M/Z' 'Intensity'}
colheaders: {'M/Z' 'Intensity'}
© The MathWorks, Inc.
```

The importdata function of the above program 340 is an example of a processing function 312 used to read in the first mass spectra data 330. The data values of the first mass spectra data set 330 are stored in the data field of the daf_0181 structure. Another processing function 312 of a plot command is shown in the following set of executable instructions 340 to create a graph of the data.

```
plot(daf_0181.data(:,1),daf_0181.data(:,2))
% The column headers are in the colheaders field. These can be used for the
% X and Y axis labels.
xAxisLabel=daf_0181.colheaders{1};
yAxisLabel=daf_0181.colheaders{2};
xlabel(xAxisLabel);
ylabel(yAxisLabel);
% The default X axis limits are a little loose, these can be made tighter
% using the axis XLim property.
xAxisLimits=[daf_0181.data(1,1),daf_0181.data(end,1)];
set(gca,'xlim',xAxisLimits)
```

© The MathWorks, Inc.

Figure 4A:
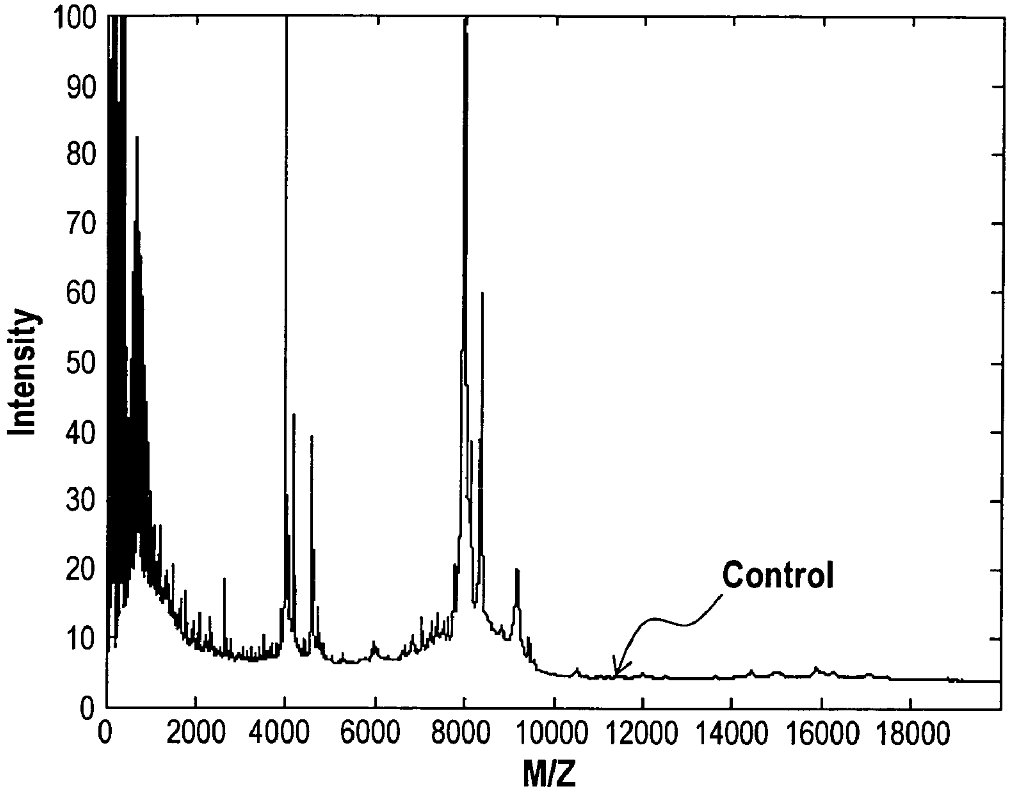
FIGS. 4A–4H depict various graphical plots of mass spectra data sets used as illustrative examples in practicing an illustrative embodiment of the present invention.

The resulting graph of the first mass spectra data set 330 is shown in FIG. 4A. This graph shows the various intensity values of the mass spectra data to train the classifier. As depicted by the graph of FIG. 4A, the first mass spectra data set 330 has various interesting peaks of intensity signal strength between the 0 and 10,000 m/z range with low intensity signal values after approximately 10,000 m/z.

FIG. 3A also depicts sample mass spectra data set 350 that can be classified by the classifier 320 trained in accordance with the techniques of the present invention. The sample mass spectra data 350 may comprise on or more sample mass spectra data sets 350 in any format readable or otherwise suitable to use by the program 340 or the computing environment 310.

In one embodiment, the sample mass spectra data set 350 can be read from storage locally on the computer 102. Also, the sample mass spectra data set 350 could have been received, downloaded, or otherwise obtained from any other computing device 102, device readable medium, or transmission medium. The following illustrative executable instructions of a program 340 uses various processing functions 312 to import in a mass spectra sample from the Ovarian Cancer directory provided by the uncompressed Ovarian Dataset 8-7-02 used in this illustrative embodiment:

```
cd ../'Ovarian Cancer'
daf_0601=importdata('Ovarian Cancer daf-0601.csv')
hold on
plot(daf_0601.data(:,1),daf_0601.data(:,2),'r')
legend({'Control','Ovarian Cancer'});
hold off
daf_0601=
data: [15154x2 double]
textdata: {'M/Z' 'Intensity'}
colheaders: {'M/Z' 'Intensity'}
```

© The MathWorks, Inc.

Figure 4B:
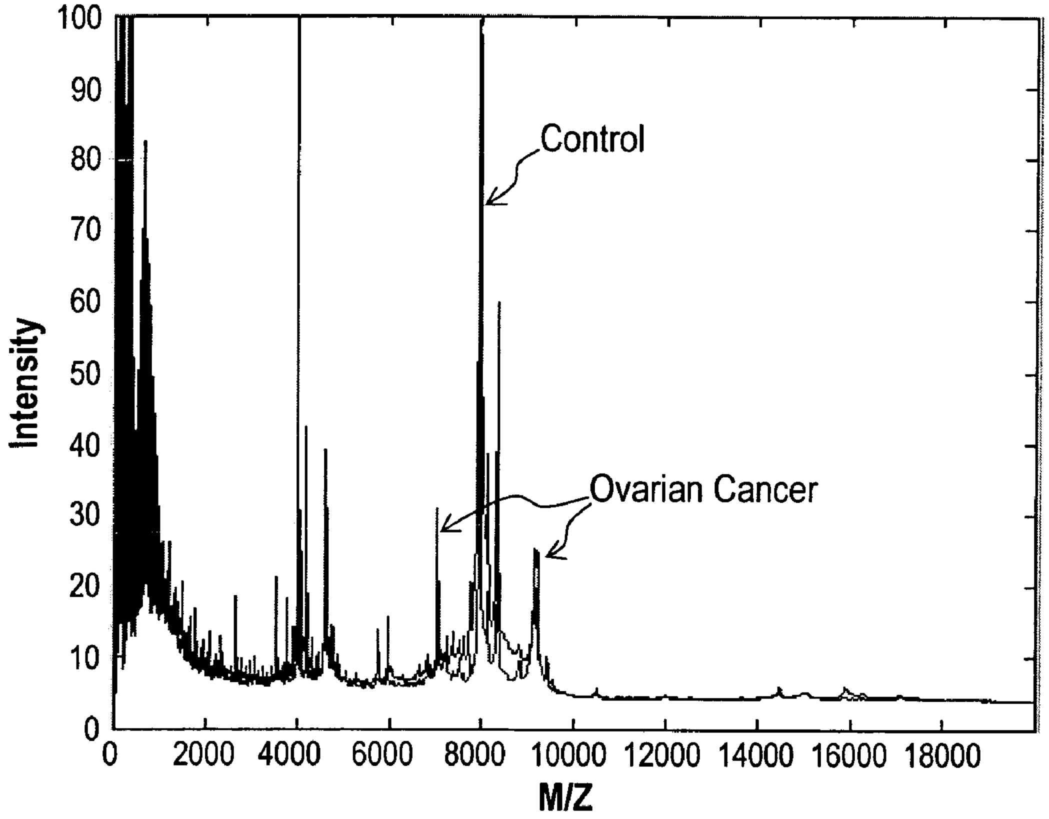

The sample mass spectra data set 330 can be plotted into graphical form as shown in FIG. 4B by executing the following program 340:

```
figure
hNH=plot(NH_MZ,NH_IN(:,1:5),'b');
hold on;
hOC=plot(OC_MZ,OC_IN(:,1:5),'r');
set(gca,'xlim',[daf_0181.data(1,1),daf_0181.data(end,
  1)])
xlabel(xAxisLabel);
ylabel(yAxisLabel);
set(gca,'xlim',xAxisLimits)
legend([hNH(1),hOC(1)],{'Control','Ovarian Cancer'})
```

© The MathWorks, Inc.

As shown in the graphical plot of FIG. 4B, the sample mass spectra data set 350 has some peaks more pronounced than in the control data of the first mass spectra data set 330 in the 7000 to 9500 m/z range. Using the following executable instructions 340, the first mass spectra data set 330 and the sample mass spectra data 350 can be replotted to better view the intensity values, peaks and other characteristics of the data in the 6500 to 10000 m/z range:

```
set(gca,'xlim',[6500,10000],'ylim',[0,50]);
```

Figure 4C:
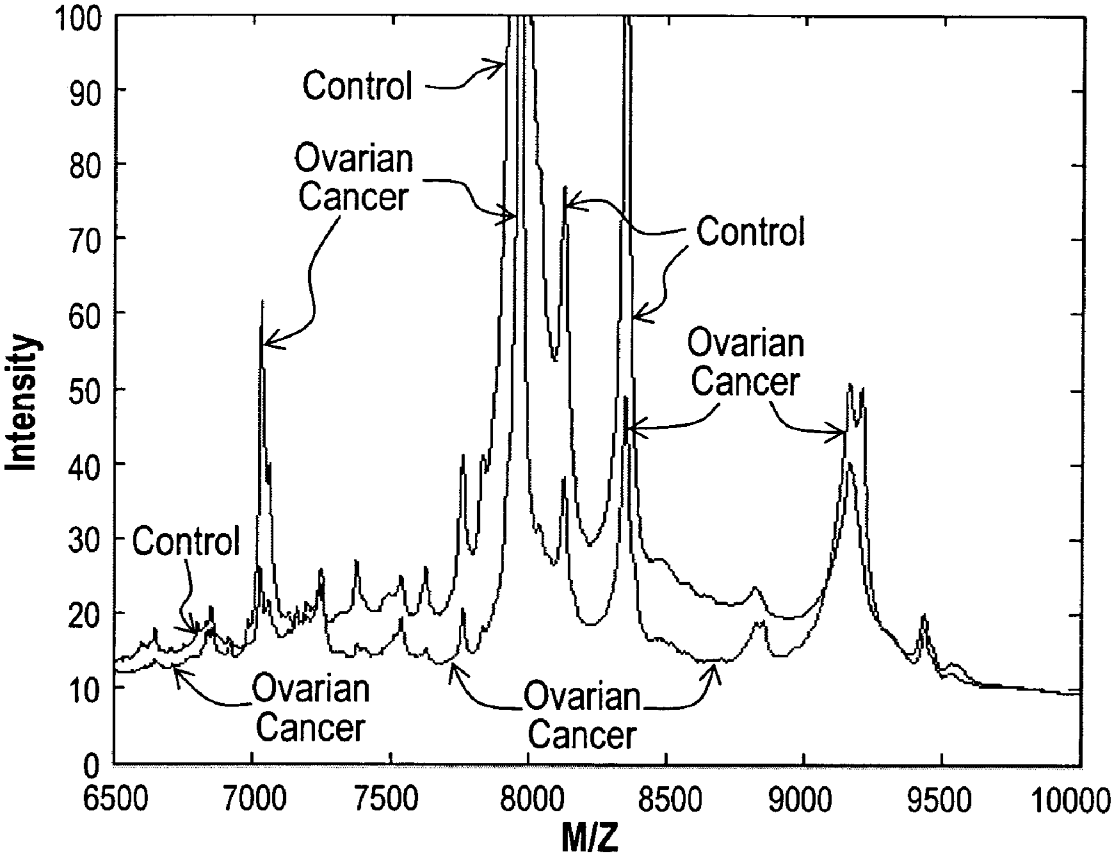

The resulting graph is shown in FIG. 4C.

In this illustrative example, the Ovarian Dataset 8-7-02 has multiple sample mass spectra data sets 350 that can be processed and plotted against the control data of the first mass spectra data set 330. In this embodiment, the program 340 illustrates the use of a more efficient cvsread processing function 312 to read in a large number of similar files:

```
OC_files=dir('*.csv');
% Preallocate some space for the data.
numOC=numel(OC_files);
numValues=size(daf_0601.data, 1);
OC_IN=zeros(numValues,numOC);
% The m/z values are constant across all the samples.
OC_MZ=daf_0601.data(:,1);
% Loop over the files and read in the data.
for i=1:numOC
OC_IN(:,i)=csvread(OC_files(i).name,1,1);
end
```

© The MathWorks, Inc.

Repeat this for the control data.

```
cd ../Control
NH_files=dir('*.csv');
% Preallocate some space for the data.
numNH=numel(NH_files);
numValues=size(daf_0181.data,1);
NH_IN=zeros(numValues,numNH);
NH_MZ=daf_0181.data(:,1);
% Loop over the files and read in the data.
for i=1:numNH
NH_IN(:,i)=csvread(NH_files(i).name,1,1);
end
```

© The MathWorks, Inc.

Figure 4D:
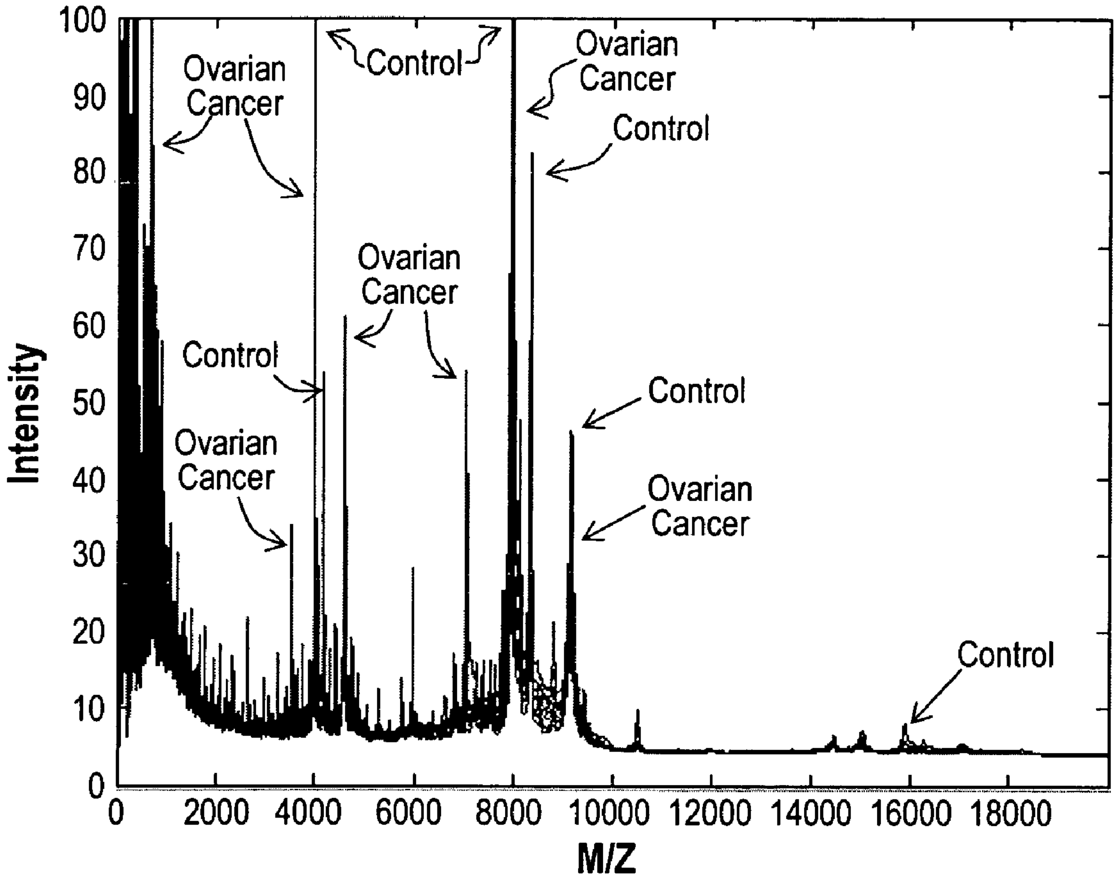

Using the processing functions 312 of the following program 340, multiple first mass spectra data sets 330 and sample mass spectra data sets 350 may be plotted in the same graph as depicted in FIG. 4D.

```
figure
hNH=plot(NH_MZ,NH_IN(:,1:5),'b');
hold on;
hOC=plot(OC_MZ,OC_IN(:,1:5),'r');
set(gca,'xlim',[daf_0181.data(1,1),daf_0181.data(end,
1)])
xlabel(xAxisLabel);
ylabel(yAxisLabel);
set(gca,'xlim',xAxisLimits)
legend([hNH(1),hOC(1)],{'Control','Ovarian Cancer'})
```

© The MathWorks, Inc.

Although shown in a single graph, the mass spectra data sets 330 and 350 could have been processed via processing functions 312 of the program 340 to be plotted in multiple graphical forms and in different plot types as one ordinarily skilled in the art will appreciate.

In continuing with this example, the mass spectrum signals of the first mass spectra data set 330 may be preprocessed in accordance with the step of 205' of the previously described methods of FIGS. 2A–2C. Using a computing environment 310 such as the technical computing environment of MATLAB® from The MathWorks, Inc. of Natick, Mass., MATLAB® the mass spectrum signals plotted in the graph depicted in FIG. 4F can be baseline corrected. From view of this graph, it can be seen that the values of the intensity signals do not have a baseline near zero. The following example of MATLAB® executable instructions may be used to baseline correct the mass spectrum signals represented in the graph of FIG. 4F using a windowed piecewise cubic interpolation method:

```
D=[NH_IN OC_IN];
ns=size(D,1); % number of points
nC=size(OC_IN,2); % number of samples with cancer
nH=size(NH_IN,2); % number of healty samples
tn=size(D,2); % total number of samples
w=75; % window size
temp=zeros(w,ceil(ns/w))+NaN;
for i=1:tn
temp(1:ns)=D(:,i);
```

```
[m,h]=min(temp);
g=h>1 & h<w;
h=w*[0:numel(h)−1]+h;
m=m(g);
h=h(g);
D0(:,i)=[temp(1:ns)−interp1(h,m,1:ns,'pchip')]';
end
figure
plot(NH_MZ,D0(:,1:50:end))
set(gca,'xlim',[daf__0181.data(1,1),daf__0181.data(end, 1)])
xlabel(xAxisLabel);
ylabel(yAxisLabel);
set(gca,'xlim',xAxisLimits)
© The MathWorks, Inc.
```

Figure 4E:
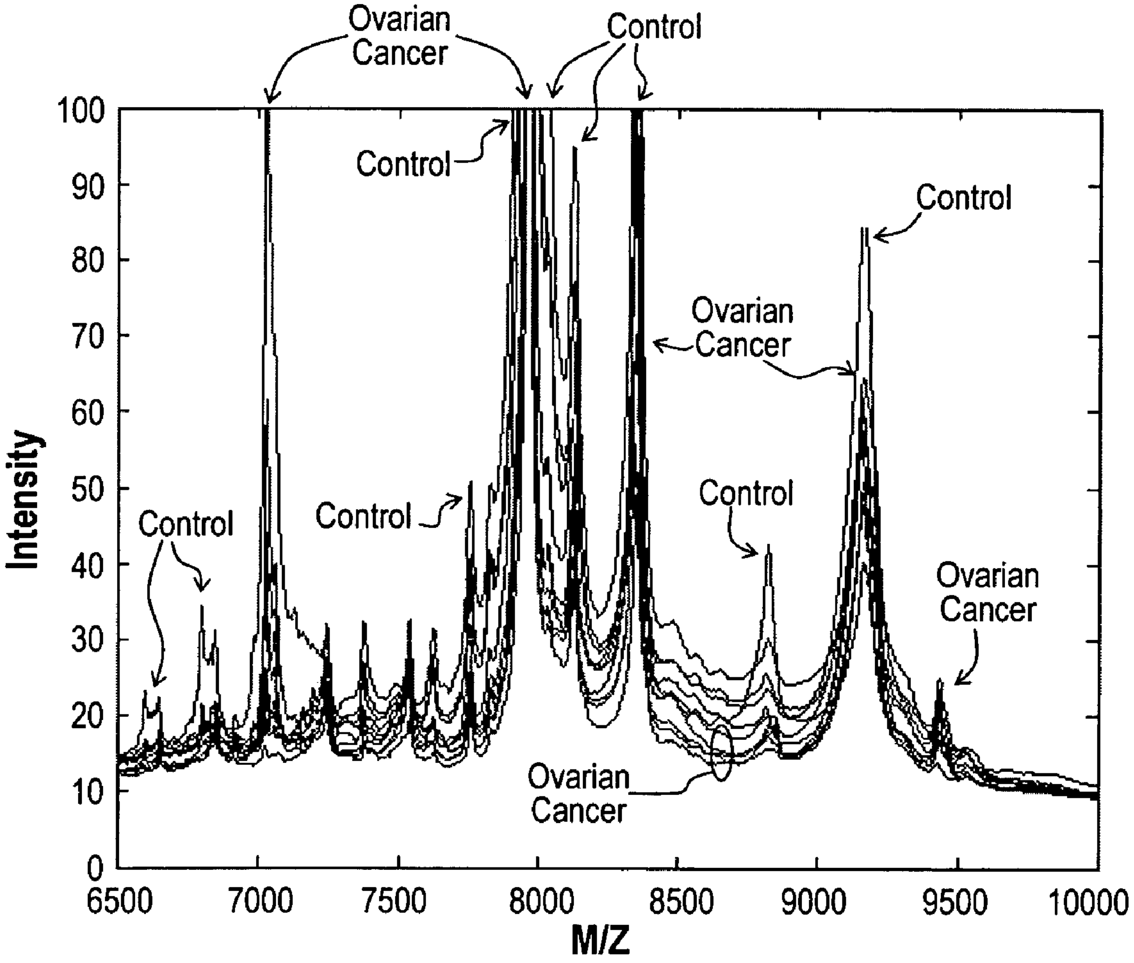
Figure 4F:
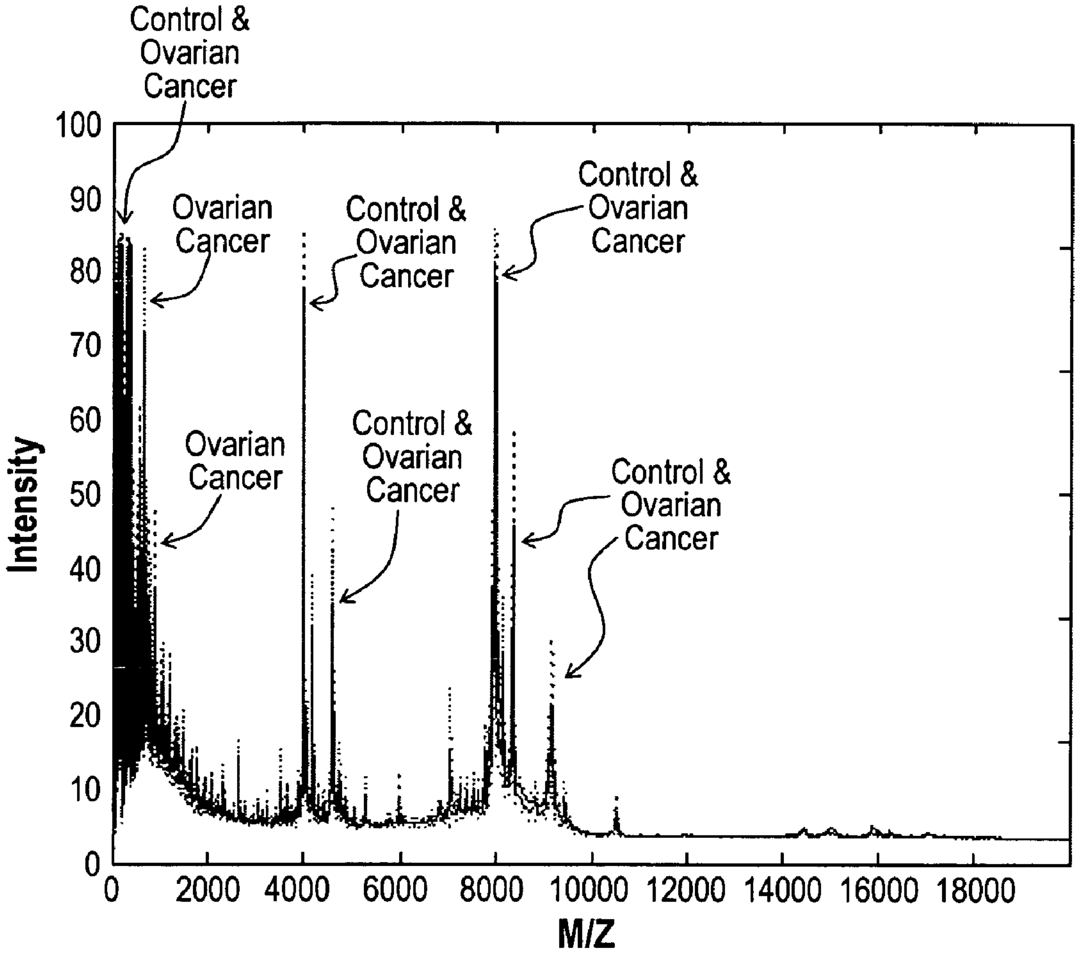
Figure 4G:
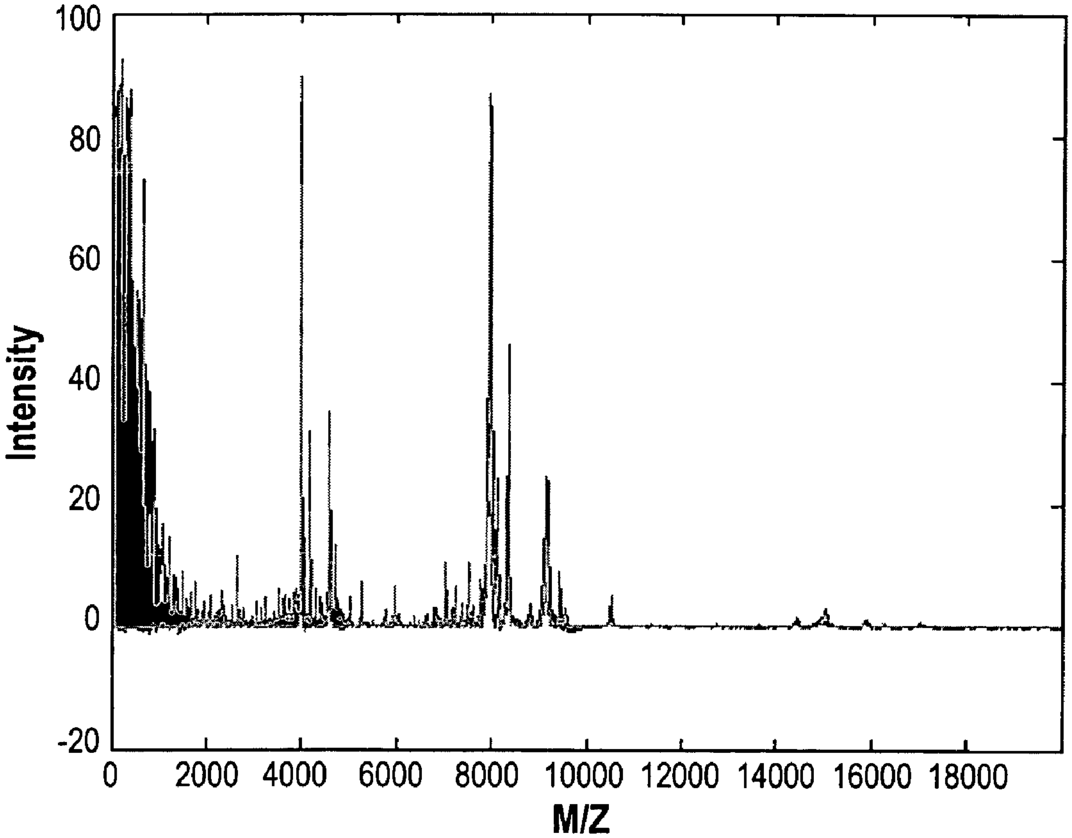

The execution of the above example may result in the mass spectrum signals with a baseline correction being represented in the graph as depicted in FIG. 4G. Although the first mass data set 330 was shown by this example to be baseline corrected, the program 340 may have also performed other preprocessing steps, instead of or in addition to the baseline correction, as described above with respect to the methods of FIGS. 2A–2C. For example, the program 340 may have executed other executable instructions and processing functions 312 to normalize, case correct, peak align, smooth or case correct the first mass spectra data set 330.

Also, in accordance with the method of FIGS. 2A–2C, the first mass spectra data 330 set may be further processed to form a second mass spectra data set 340 by reducing the data to a subset of data having interesting or significant features. One approach to finding features in the first mass spectra data set 330 which are significant is to assume that each m/z value is independent and do a two-way t-test as described by the following MATLAB® programming language statements:

```
numPoints=numel(NH_MZ);
h=false(numPoints,1);
p=nan+zeros(numPoints,1);
for count=1:numPoints
[h(count)    p(count)]=ttest2(NH_IN(count,:),OC_IN
    (count,:),.0001,'both','unequal');
end
% h can be used to extract the significant m/z values
sig_Masses=NH_MZ(find(h));
© The MathWorks, Inc.
```

The p-values of the mass spectra may be plotted using the following MATLAB® programming statements:

```
figure(hFig);
plot(NH_MZ,−log(p),'g')
© The MathWorks, Inc.
```

Figure 4H:
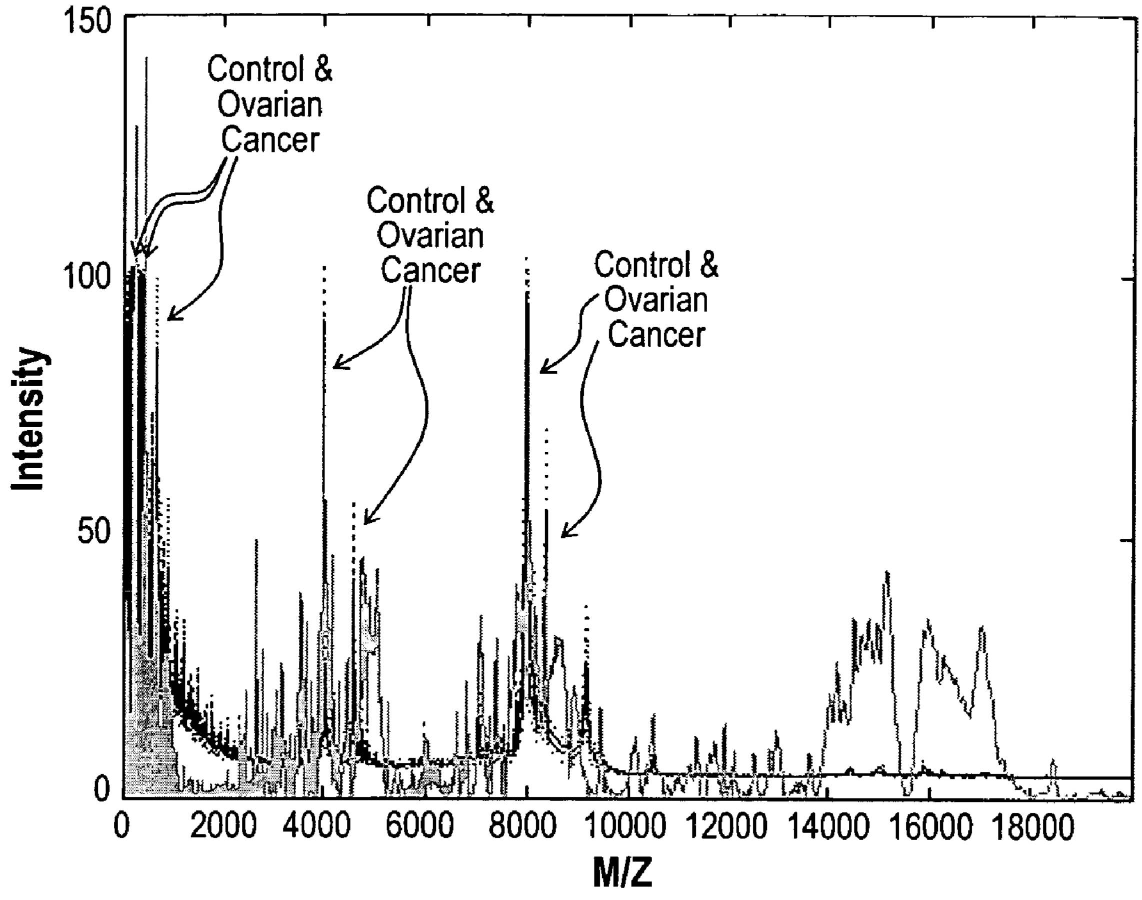

The resulting plot is shown in the graph of FIG. 4H. From view of this graph, there are regions of interest at high m/z values but have low intensities. Furthermore, one could use the p-value to determine significant features by executing the following instruction:

```
sig_Masses=NH_MZ(find(p<1e-6)); © The MathWorks, Inc.
```

One ordinarily skilled in the art will appreciate that a p-value, or probability value, is the actual probability associated with a statistical estimate. The p-value is then compared with a significance level to determine whether that value is statistically significant. For a statistically significant result, the p-value must be less than or equal to the significance level.

Another way to look at mass spectra data 330 to determine any significant features is to look at an average of multiple sets of similar mass spectra data sets, such as a control sample versus samples with a known condition. The following MATLAB programming language statements perform this average and plot a mean standard deviation:

```
mean_NH=mean(NH_IN,2);
std_NH=std(NH_IN,0,2);
mean_OC=mean(OC_IN,2);
std_OC=std(OC_IN,0,2);
hFig=figure;
hNHm=plot(NH_MZ,mean_NH,'b'):
hold on
hOCm=plot(OC_MZ,mean_OC,'r');
plot(NH_MZ,mean_NH+std_,'b:')
plot(NH13 MZ,mean_NH−std_NH,'b:')
plot(OC_MZ,mean_OC+std_,'r:')
plot(OC_MZ,mean_OC−std_OC,'r:')
set(gca,'xlim',[daf__0181.data(1,1),daf__0181.data(end, 1)])
xlabel(xAxisLabel);
ylabel(yAxisLabel);
set(gca,'xlim',xAxisLimits)
legend([hNHm,hOCm], {'Control','Ovarian Cancer'})
© The MathWorks, Inc.
```

The resulting graph is shown in FIG. 4E. One ordinarily skilled in the art will recognize that one can programmatically process the first mass spectra data set 330 in forming a second mass spectra data set 350 for training a classifier via many types of processing functions 312 called by many forms of executable instructions which can be executed in many types of computing environments 310.

In accordance with the techniques of the present invention, one or more derivatives are performed on the mass spectrum data 330 to form the second mass spectra data set 340 for training the classifier. In an illustrative embodiment of the programming language of MATLAB®, a derivative function 314 can be called to perform difference calculations or derivative calculations. For example, the diff( ) function of MATLAB® can be used to calculate differences between adjacent elements of an input data value:

```
% Using the derivative for classification instead of the raw signal
DI=diff (DO) % © The MathWorks, Inc.
```

In one embodiment of the present invention, if the diff( ) function is applied to uniformly spaced data,e.g., if the DO data is uniformly spaced, then the equivalent of a derivative calculation is performed. In another embodiment of the present invention, if the diff( ) function operates on non-uniformly spaced data then the diff( ) function acts as a high-pass filter. One ordinarily skilled in the art will appreciate how the functionality of the diff( ) function of MATLAB® may perform either a derivative or high-pass filtering depending on the uniformity of the data set.

In the above example, the DO expression may be a vector, such as a list or an array, comprising the intensity signal values of the mass spectra data set 330 obtained at step 210. The diff function then calculates the difference between adjacent elements of DO by performing the following calculation:

[DO(2)−DO(1)DO(3)−DO(2) . . . DO(n)−DO(n−1)]

In another case, the DO expression may be a matrix representing a matrix of the m/z range and corresponding intensity value of the mass spectra data set 330. Then the diff function returns a matrix of row differences by performing the following calculation:

[DO(2:m,:)−DO(1:m−1,:)]

The computing environment 310 of MATLAB® also supports other differential and difference calculation functions such as the gradient function which performs a numerical partial derivative of a matrix, and a del2 function which performs a discrete Laplacian of a matrix. One ordinarily skilled in the art will recognize that any of the derivatives, such as a first order, any second or higher order derivative, or any linear combination of derivatives, may be determined via a variety of executable instructions capable of performing the functionality of a derivative function 314. In a similar manner, a high pass filter may be performed by calling any processing functions 312, derivative functions 314 or any other executable instructions capable of providing a high pass filter mechanism as one ordinarily skilled in the art will appreciate.

The computing environment 310 may also provide a classifier 320 to provide for classifying mass spectra data in accordance with the present invention. The classifier 320 may comprise any type of program 340, executable instructions, application, library, system, or device capable of performing classification of mass spectra data. In the exemplary embodiment of the computing environment 310 of MATLAB®, there are many classification tools. The Statistics Toolbox of MATLAB® includes classification trees and discriminant analysis functionality. A Neural Network type classification model, such as an artificial neural network classifier, could be implemented using the Neural Network Toolbox of MATLAB®, and a Support Vector Machine (SVM) classifier could be implemented using the Optimization Toolbox of MATLAB®. In one embodiment, the classifier 320 comprises a classifier function available in the computing environment 310 and callable by the program 340, and may include other processing functions 312 executing instructions prior to or subsequent to the classifier function to provide the functionality of the classifier 320. As shown in the following example, the classifier function may be called to both train the classifier 320 in accordance with the illustrative method of FIG. 2A and classify one or more mass spectra samples in accordance with the illustrative method of FIG. 2B.

In the computing environment 310 of MATLAB®, a K-nearest neighbor type of classifier 320 can be used for classification in the following illustrative program 340 listing:

```
% Calculate some useful values
D=[NH_IN OC_IN];
ns=size(D,1); % number of points
nC=size(OC_IN,2); % number of samples with cancer
nH=size(NH_IN,2); % number of healty samples
tn=size(D,2); % total number of samples
% make a indicator vector, where 1s correspond to health samples, 2s to
% ovarian cancer samples.
id=[ones(1,nH) 2*ones(1,nC)];
% K-Nearest Neighbor classifier
for j=1:10% run random simulation a few times
% Select random training and test sets %
per_train=0.5; % percentage of samples for training
nCt=floor(nC*per_train); % number of cancer samples in training
nHt=floor(nH*per_train); % number of healthy samples in % training
nt=nCt+nHt; % total number of training samples
sel_H=randperm(nH); % randomly select samples for training
sel_C=nH+randperm(nC); % randomly select samples for training
sel_t=[sel_C(1:nCt)sel_H(1:nHt)]; % samples chosen for training
sel_=[sel_C(nCt+1:end) sel_H(nHt+1:end)]; % samples for evaluation
% available from the MATLAB Central File Exchange
c=knnclassify(D(:,sel_e)‘,D(:,sel_t)’,id(sel_t),3,‘corr’);
% How well did we do?
per_corr(j)=(1−sum(abs(c−id(sel_e)‘))/numel(sel_e))*100;
disp(sprintf(‘KNN Classifier Step % d: %.2f %% correct\n’,j, per_corr(j)))
end
```

© The MathWorks, Inc.

The classification verification output from executing this program 340 in the computing environment 310 is as follows:

KNN Classifier Step 1: 96.85% correct
KNN Classifier Step 2: 94.49% correct
KNN Classifier Step 3: 99.21% correct
KNN Classifier Step 4: 96.85% correct
KNN Classifier Step 5: 96.85% correct
KNN Classifier Step 6: 96.06% correct
KNN Classifier Step 7: 93.70% correct
KNN Classifier Step 8: 96.06% correct
KNN Classifier Step 9: 94.49% correct
KNN Classifier Step 10: 94.49% correct One ordinarily skilled in the art will appreciate that classification verification is the testing process by which the classifier trained with the second mass spectra data set 340 is evaluated for its ability to correctly classify mass spectra data samples 350.

In one embodiment, a program 340 can be provided to execute a PCA (Principal Component Analysis)/LDA (Linear Discriminant Analysis) type of classifier 320. In this example, the following programming instructions represent a simplified version of the "Q5" algorithm for a PCA/LDA Classifier proposed by Lilien et al in "Probabilistic Disease Classification of Expression-Dependent Proteomic Data from Mass Spectrometry of Human Serum," (with R. Lilien and H. Farid), Journal of Computational Biology, 10(6) 2003, pp. 925–946:

```
for j=1:10% run random simulation a few times
% Select random training and test sets %
per_train=0.5; % percentage of samples for training
nCt=floor(nC*per_train); % number of cancer samples in training
nHt=floor(nH*per_train); % number of healthy samples in % training
nt=nCt+nHt; % total number of training samples
sel_H=randperm(nH); % randomly select samples for training
sel_C=nH+randperm(nC); % randomly select samples for training
sel_t=[sel_C(:nCt) sel_H(:nHt)]; % samples chosen for training
sel_e=[sel_C(nCt+1:end) sel_H(nHt+1:end)]; % samples for evaluation
% select only the significant features.
ndx=find(p<1e-6);
% PCA to reduce dimensionality
P=princomp(D(ndx,sel_t)’,‘econ’);
% Project into PCA space
x=D(ndx,:)’*P(:,1:nt−2);
% Use linear classifier
c=classify(x(sel_e,:),x(sel_t,:),id(sel_t));
% How well did we do?
```

```
per_corro)=(1−sum(abs(c−id(sel_e)'))/numel(sel_e))
   *100;
disp(sprintf('PCA/LDA Classifier Step % d: %.2f %%
   correct\n',j, per_(j)))
end
```

© The MathWorks, Inc.

The classification verification output from executing this program 340 in the computing environment 310 is as follows:

PCA/LDA Classifier Step 1: 100.00% correct
PCA/LDA Classifier Step 2: 100.00% correct
PCA/LDA Classifier Step 3: 100.00% correct
PCA/LDA Classifier Step 4: 100.00% correct
PCA/LDA Classifier Step 5: 100.00% correct
PCA/LDA Classifier Step 6: 100.00% correct
PCA/LDA Classifier Step 7: 100.00% correct
PCA/LDA Classifier Step 8: 100.00% correct
PCA/LDA Classifier Step 9: 100.00% correct
PCA/LDA Classifier Step 10: 100.00% correct In accordance with the present invention, instead of working with the raw mass spectrum intensity values, the PCA/LDA classifier of the program 340 can be programmed to execute using high-pass filtering of the mass spectrum signals. The following MATLAB® executable instruction listing shows an illustrative embodiment of a program 340 performing the classification techniques of the present invention:

DI=diff(D0); % if DO is non-uniformly spaced then performs high pass filtering % in accordance with the present % invention to form a second data set 340 from the first data set 310

```
for j=1:10% run simulation 10 times
% Select random training and test sets %
per_train=0.5; % percentage of samples for training
nCt=floor(nC*per_train); % number of cancer samples in
   training
nHt=floor(nH*per_train); % number of healthy samples
   in training
nt=nCt+nHt; % total number of training samples
sel_H=randperm(nH); % randomly select samples for
   training
sel_C=nH+randperm(nC); % randomly select samples for
   training
sel_t=[sel_C(1:nCt) sel_H(1:nHt)]; % samples chosen for
   training
sel_e=[sel_C(nCt+1:end) sel_H(nHt+1:end)]; % samples
   for evaluation
% This time use an entropy based data reduction method
md=mean(DI(:,sel_t(id(sel_t)==2)),2); % mean of
   healthy samples
Q=DI−repmat(md, 1,tn); % residuals
mc=mean(Q(:,sel_t(id(sel_t)==1)),2); % residual mean of
   cancer samples
sc=std(Q(:,sel_t(id(sel_t)==1)),[ ],2); % and also std
[dump,sel]=sort(−abs(mc./sc)); % metric to reduce
   samples
sel=sel(1:2000);
% PCA/LDA classifier
P=princomp(Q(sel,sel_t)','econ');
x=Q(sel,:)'*P(:,1:nt−3);
% Use linear classifier
c=classify(x(sel_e,:),x(sel_t,:),id(sel_t));
% How well did we do?
per_corr(j)=(1−sum(abs(c−id(sel_e)'))/numel(sel_e))
   *100;
disp(sprintf('PCA/LDA Classifier % d: %.2f %%
   correct\n',j, per_corr(j)))
end
```

© The MathWorks, Inc.

The classification verification output from executing this program 340 may comprise the following:

PCA/LDA Classifier 1: 100.00% correct
PCA/LDA Classifier 2: 100.00% correct
PCA/LDA Classifier 3: 100.00% correct
PCA/LDA Classifier 4: 100.00% correct
PCA/LDA Classifier 5: 100.00% correct
PCA/LDA Classifier 6: 100.00% correct
PCA/LDA Classifier 7: 100.00% correct
PCA/LDA Classifier 8: 100.00% correct
PCA/LDA Classifier 9: 100.00% correct
PCA/LDA Classifier 10: 100.00% correct Using the systems and methods of the present invention, the PCA/LCD classifier 320 of the computing environment 310 provides for the improvement of the classification of mass spectra data. Although generally illustrated above with specific types of classifiers 320, the techniques of the present invention may be used with any type of classifier 320.

In conjunction with FIGS. 5A–5I, another illustrative example of the present invention will be discussed below. As in the previous example, a computing environment 310 such as the technical computing environment of MATLAB® may be used to practice the classification techniques of the present invention described herein. The following executable instructions of an illustrative program 340 loads in files of the Ovarian Dataset 8-7-02 from the Clinical Proteomics Program Databank to be used in this example:

```
clear all;
close all;
repository='F:/MassSpecRepository/Ovarian Dataset
8-7-02/';
repositoryC=[repository 'Ovarian Cancer/'];
repositoryN=[repository 'Control/'];
filesCancer=dir([repositoryC '*.csv']);
NumberCancerDatasets=numel(filesCancer)
filesNormal=dir([repositoryN '*.csv']);
NumberNormalDatasets=numel(filesNormal)
files=[regexprep({filesCancer.name},'(.+)', [repositoryC
'$1']) . . .
regexprep({filesNormal.name},'(.+)', [repositoryN
   '$1'])];
N=numel(files)
for i=1:N
d=importdata(files {i});
MZ=d.data(:,1);
Y(:,i)=d.data(:,2);
end
% setting some variables
lbls={'Cancer','Normal'}; % Group labels
grp=lbls([ones(NumberCancerDatasets,1);
ones(NumberNormalDatasets,1)+1]); % Ground truth
Cidx=strcmp('Cancer',grp); % Logical index vector for
Cancer samples
Nidx=strcmp('Normal',grp); % Logical index vector for
Normal samples
xAxisLabel='Mass/Charge (M/Z)'; % x label for plots
yAxisLabel='Ion Intensity'; %
```

© The MathWorks, Inc.

Figure 5A:
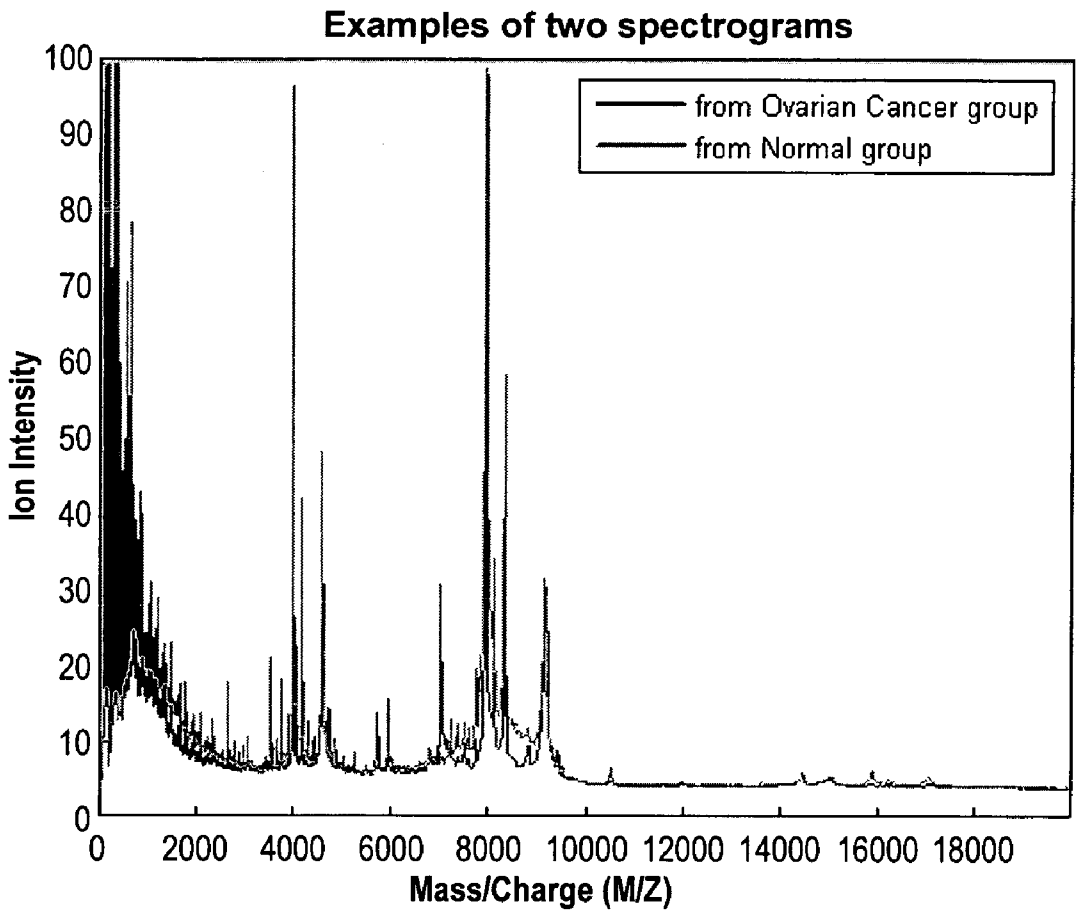
FIGS. 5A–5J depict various graphical plots of mass spectra data sets used as illustrative examples in practicing another illustrative embodiment of the present invention.
Figure 5B:
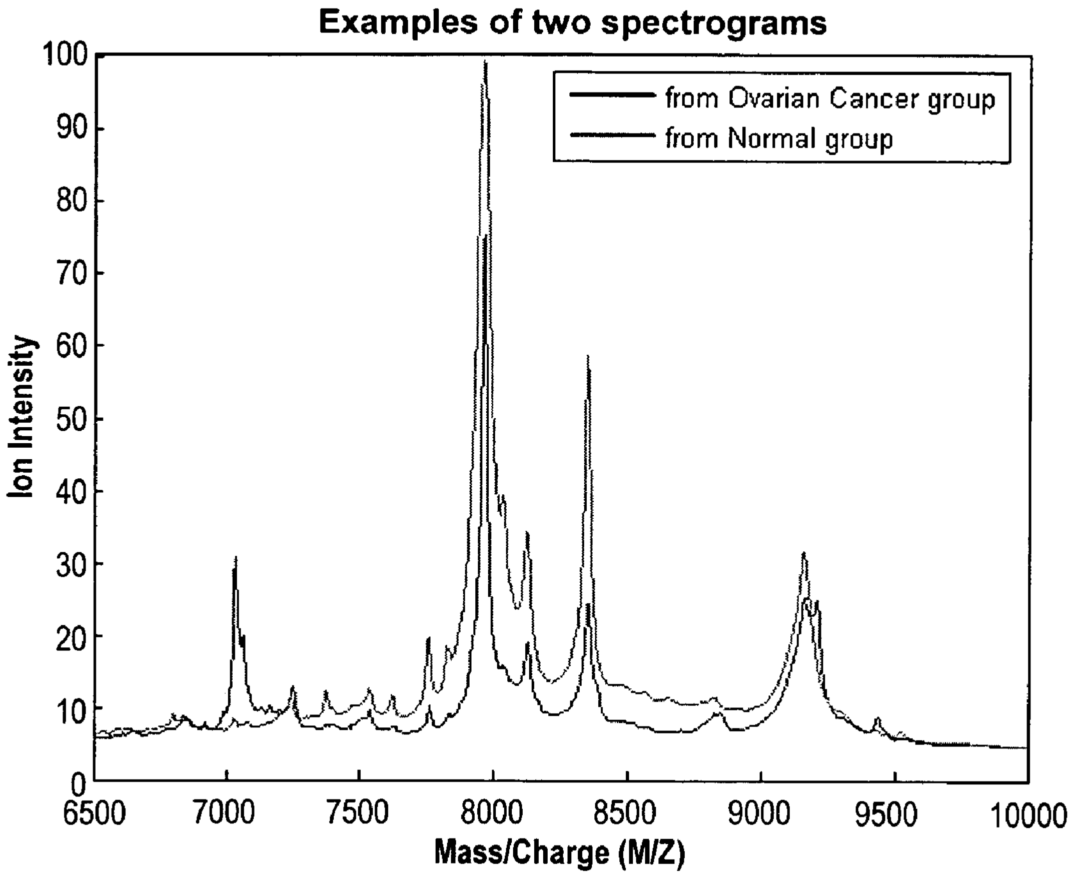

The following executable instructions provide the graph of two spectrograms of FIG. 5A showing mass spectra data from an Ovarian Cancer Group and another from a Normal Group

```
figure; hold on
plot(MZ,Y(:,1),'b')
plot(MZ,Y(:,200),'g')
```

legend('from Ovarian Cancer group','from Normal group')
title('Examples of two spectrograms')
xlabel(xAxisLabel);ylabel(yAxisLabel);
% The default X axis limits are a little loose, these can be made tighter
% using the axis XLim property.
xAxisLimits=[MZ(1),MZ(end)];
set(gca,'xlim',xAxisLimits)
© The MathWorks, Inc.

Figure 5C:
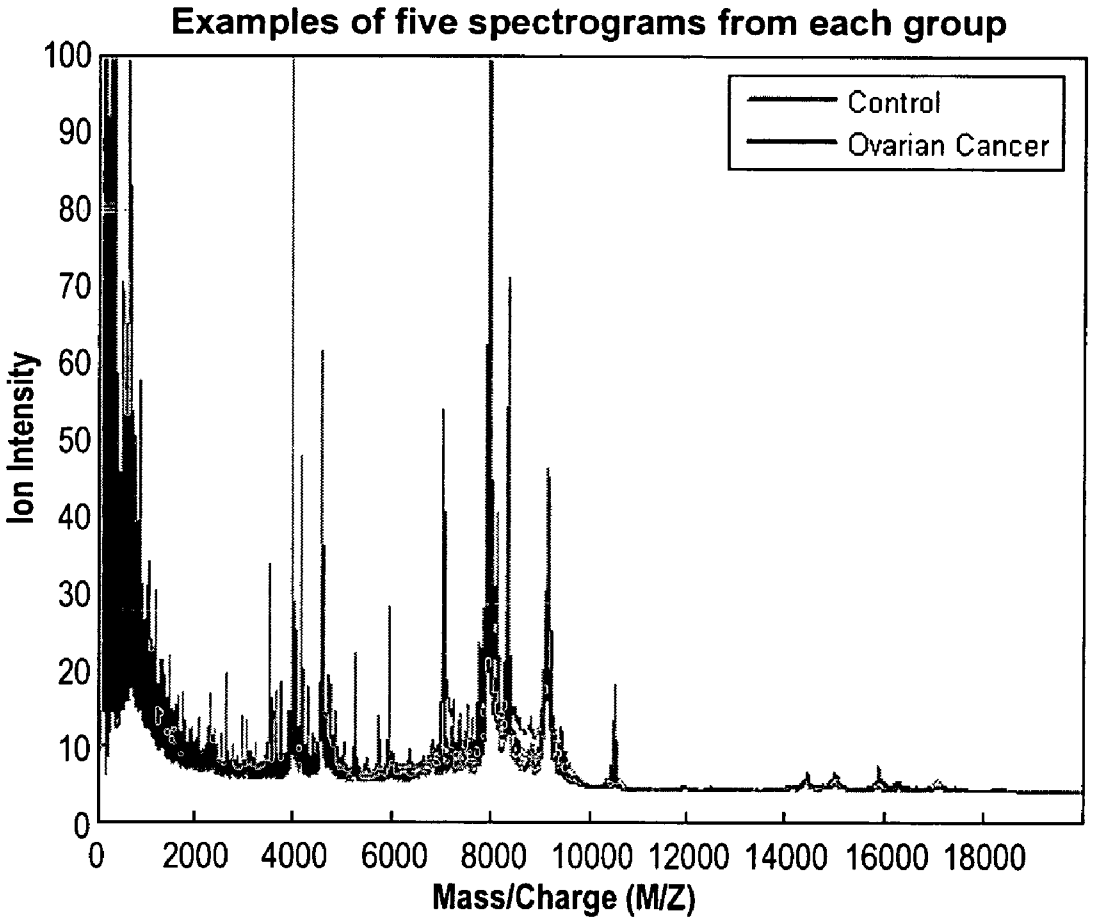

By inspection of the illustrative graph of FIG. 5A, interesting features are observed around the 7,000 to 9,500 m/z range. In the graph of FIG. 5A, there are some peaks that are more pronounced in the cancer samples of the Ovarian Cancer group than the control group of the Normal Group. The spectrograms of FIG. 5A can be re-plotted as in FIG. 5B to provide a better view of the peaks in the 7,000 to 9,500 m/z range by executing the following instructions:

set(gca,'xlim',[6500,10000]);

Additionally, multiple mass spectra from the loaded Ovarian Dataset 8-7-02 may be plotted on the same graph as depicted in FIG. 5C by executing the following instructions:

figure; hold on;
hOC=plot(MZ,Y(:, 1:5),'b');
hNH=plot(MZ,Y(:,201:205),'g');
legend([hNH(1),hOC(1)], {'Control','Ovarian Cancer'})
title('Examples of five spectrograms from each group')
xlabel(xAxisLabel);ylabel(yAxisLabel);
set(gca,'xlim',xAxisLimits)
© The MathWorks, Inc.

Figure 5D:
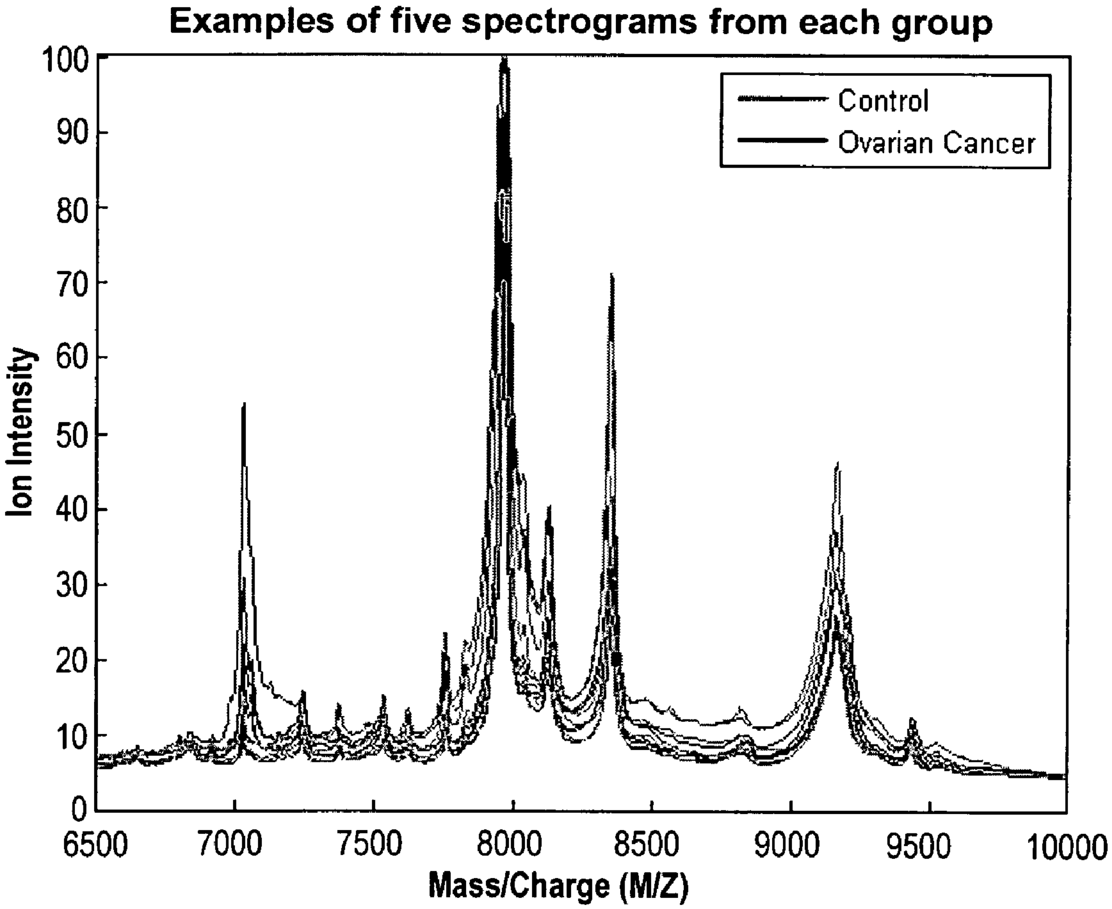
Figure 5E:
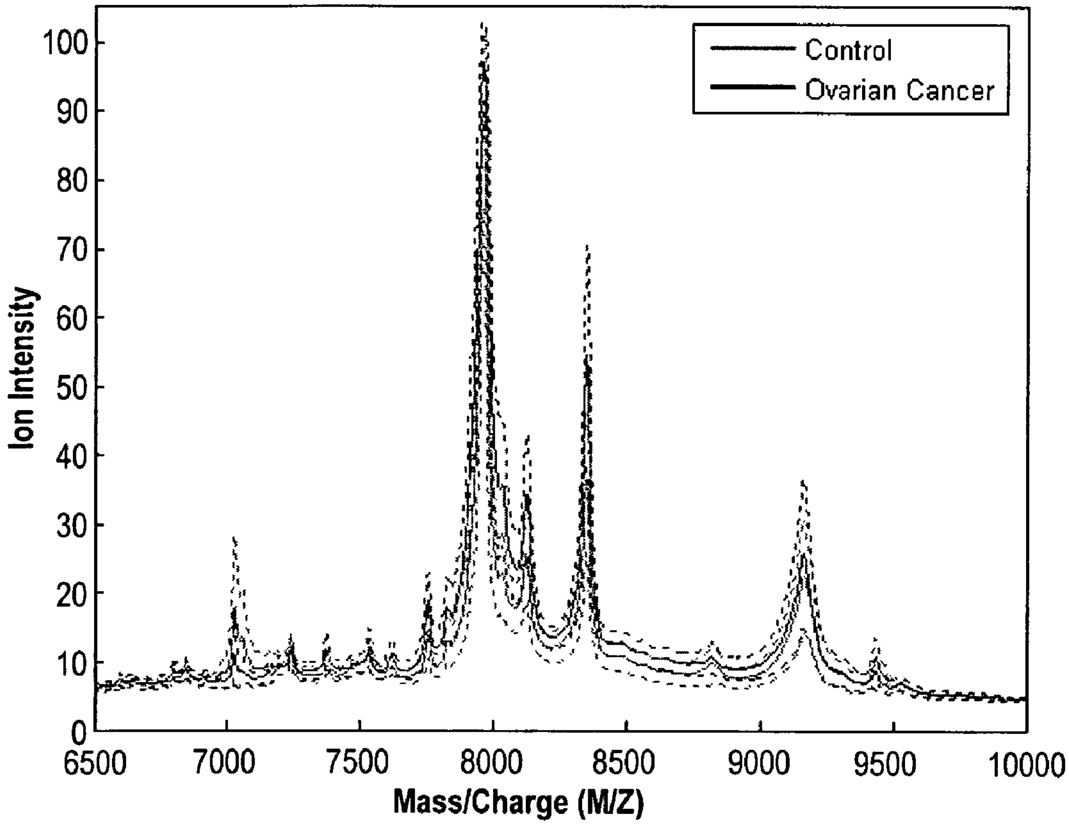

The multiple mass spectra data can be graphed as in FIG. 5D to zoom in on the region 7,000 to 9,500 m/z range to show some peaks that may be useful for classification purposes. The instruction of "set(gca,'xlim',[6500,10000])" may be executed to provide the illustrative graph of FIG. 5D.

Another way to visualize the multiple mass spectra data sets plotted in FIGS. 5C and 5D is to plot the average signal, such as the mean+/−one standard deviation, for both the Control group and the Ovarian Cancer group of mass spectra data sets. The following program 340 example may be used to determine the average signal and provide the graph of FIG. 5E:

mean_NH=mean(Y(:,~Nidx),2);
std_NH=std(Y(:,~Nidx),0,2);
mean_OC=mean(Y(:,Nidx),2);
std_OC=std(Y(:,Nidx),0,2);
hFig=figure; hold on
hNHm=plot(MZ,mean_NH,'g');
hOCm=plot(MZ,mean_OC,'b');
plot(MZ,mean_NH+std_NH,'g:')
plot(MZ,mean_NH−std_NH,'g:')
plot(MZ,mean_OC+std_OC,'b:')
plot(MZ,mean_OC−std_OC,'b:')
xlabel(xAxisLabel);ylabel(yAxisLabel);
set(gca,'xlim',xAxisLimits)
legend([hNHm,hOCm], {'Control','Ovarian Cancer'})
set(gca,'xlim',[6500,10000],'ylim',[0 105]);
© The MathWorks, Inc.

In viewing the plotted data in any of the FIGS. 5A–5E, the lower range of mass spectrum intensity values are not near a zero value, and, therefore could be baseline corrected in accordance with step 205*a* of the illustrative method 200. The following program 340 example shows the use of a processing function 312 named "msbackadj" to perform a windowed piecewise cube interpolation method:

YB=msbackadj(MZ,Y,'ShowPlot',1);
set(gca,'xlim',[100,10000],'ylim', [0 105]);
© The MathWorks, Inc.

Figure 5F:
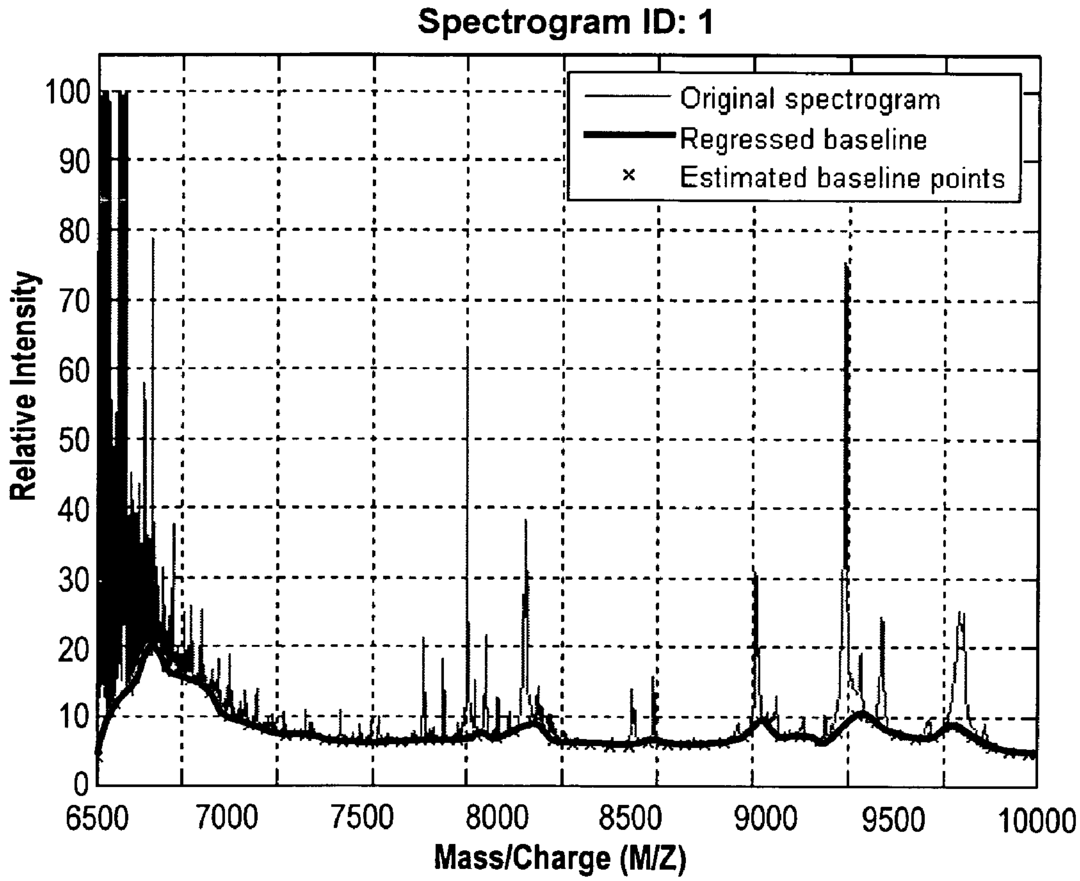

By way of example, the msbackadj function adjusts the variable baseline of a raw mass spectrum by following three steps: 1) estimates the baseline within multiple shifted windows of a certain width, such as 200 m/z,; 2) regresses the varying baseline to the window points using a spline approximation; and 3) adjusts the baseline of the spectrum (Y). The execution of the above program 340 provides the illustrative graph depicted in FIG. 5F showing the resampled baseline corrected mass spectra data.

In this example associated with FIGS. 5A–5F, the mass/charge or m/z values are already standardized so that all the mass spectra datasets have the same m/z values. If this was not the case, the data sets could be resampled so that only integer m/z values are considered by executing the following instructions:

msresample(MZ,YB,15000,'ShowPlot',1);
set(gca,'xlim',[100,10000],'ylim',[0 105]);
© The MathWorks, Inc.

Figure 5G:
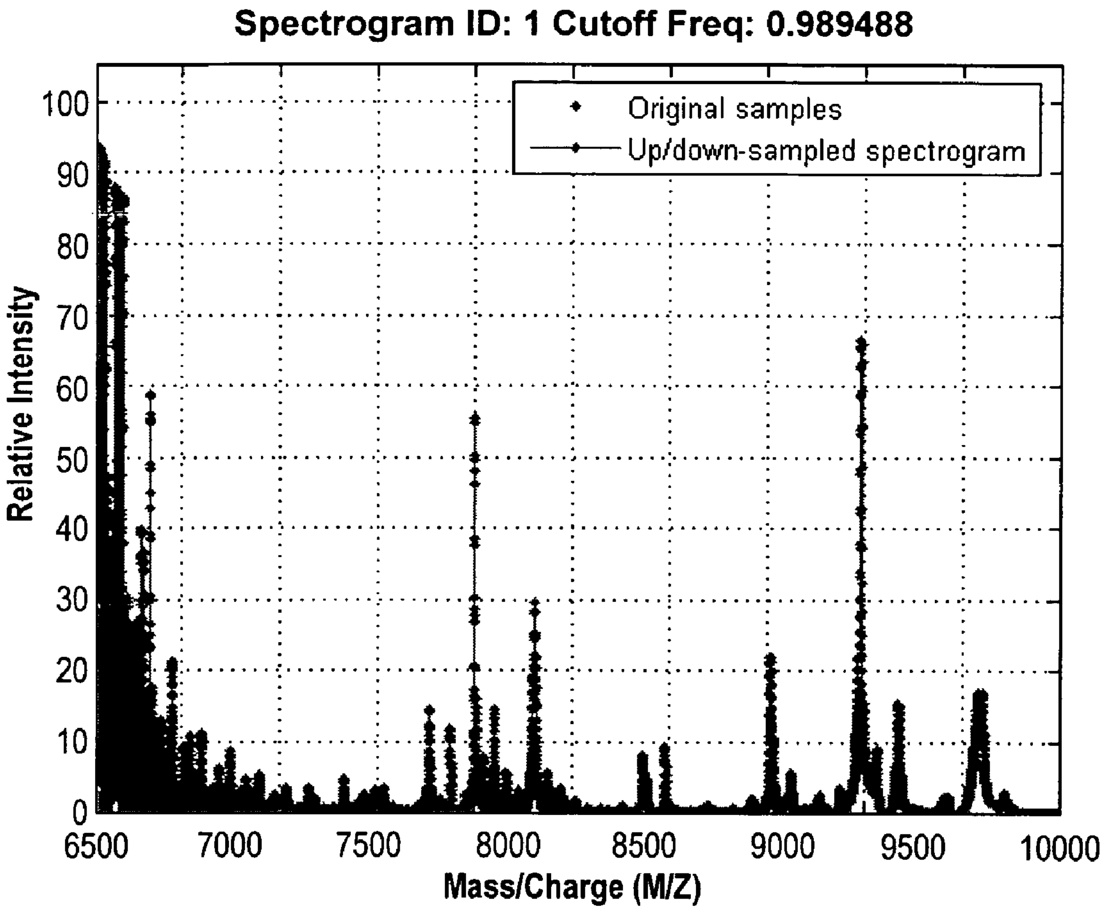
Figure 5H:
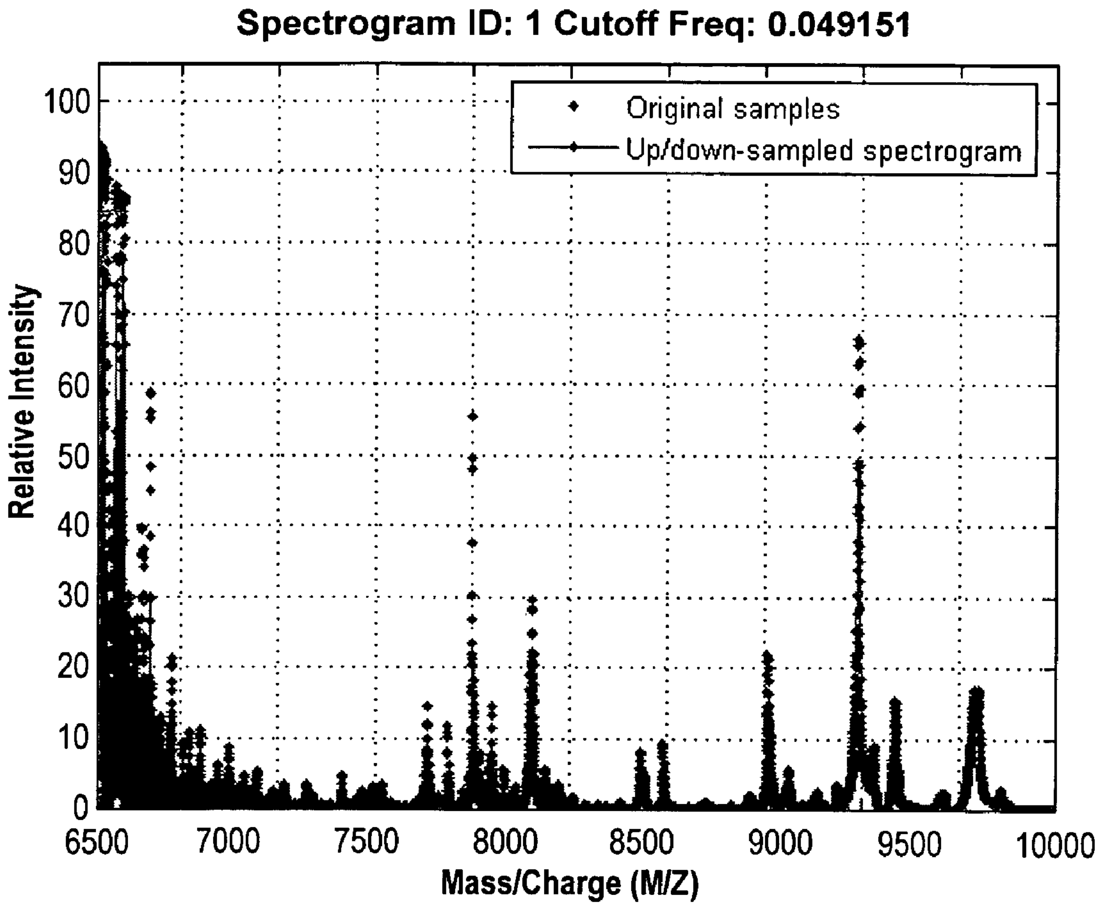
Figure 5I:
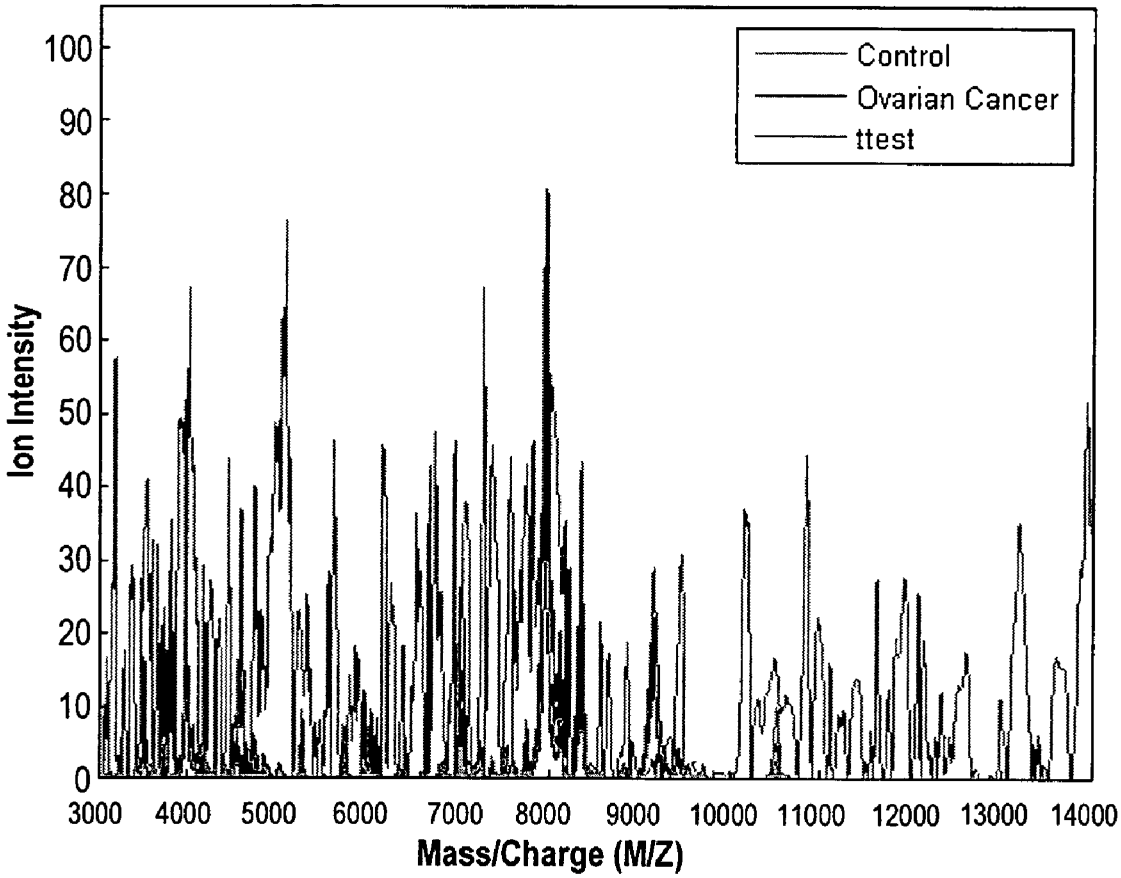

The above instructions will produce the illustrative spectrogram depicted in FIG. 5G.

In the previous example discussed in conjunction with FIGS. 4A–4H, the diff function was performed on a mass spectra data set that was not uniformly spaced and therefore the diff function behaved like a high-pass filter in accordance with one embodiment of the present invention. In this example, the diff function will be used to perform a derivative on the mass spectra data in accordance with another embodiment of the techniques of the present invention. In order for the diff function to perform a derivative function 314, the mass/charge, or m/z, deltas must be uniformly spaced. This can be accomplished by executing the following instructions:

[MZR,YR]=msresample(MZ,YB,5000,'Uniform',true, 'ShowPlot',1);
set(gca,'xlim', [100,10000],'ylim',[0 105]);
© The MathWorks, Inc.

In one embodiment, the function msresample will resample the mass spectra data to provide linearly or uniformly spaced samples within the range min(MZ) to max(MZ). The above instructions provide the illustrative spectrogram depcited in FIG. 5G.

By way of example, one approach for finding which features in the sample may be significant is to assume that each m/z value is independent and perform a two-way t-test, such as in the following example program 340:

numPoints=numel(MZR);
h=false(numPoints,1);
p=nan+zeros(numPoints,1);
for count=1:numPoints
[h(count) p(count)]=ttest2(YR(count,Nidx),YR(count, ~Nidx),.0001,'both','unequal');
end
% h can be used to extract the significant M/Z values
sig_Masses=MZR(find(h));
© The MathWorks, Inc.

The p-values can be plotted over the spectra as shown in FIG. 51 by executing the following instructions:

figure; hold on
hstat=plot(MZR,−log(p),'m');
hOC=plot(MZR,YR(:,1:5),'b');
hNH=plot(MZR,YR(:,201:205),'g');
xlabel(xAxisLabel);ylabel(yAxisLabel);
legend([hNH(1),hOC(1),hstat], {'Control','Ovarian Cancer','ttest'})
set(gca,'xlim',[3000 14000],'ylim',[0 105]);

% notice that there are significant regions at high m/z values but low

% intensity.

© The MathWorks, Inc.

Also, significant values may be extracted from the p-value executing the following instruction:

sig_Masses=MZR(find(p<1e-6)); © The MathWorks, Inc.

Since the mass/charge deltas of the mass spectra data set has been resampled to be uniformly spaced using the msresample function as discussed above, the diff function can be used to compute a derivative in accordance with step 215*a* of illustrative method 200:

```
YD=diff(YR);
figure; hold on
hOC=plot(MZR(2:end),YD(:,1:5),'b');
hNH=plot(MZR(2:end),YD(:,201:205),'g');
xlabel(xAxisLabel);ylabel('Derivative');
legend([hNH(1),hOC(1)], {'Control','Ovarian Cancer'})
set(gca,'xlim',[3000 14000]);
title('Spectrogram Derivatives')
```

© The MathWorks, Inc.

Figure 5J:
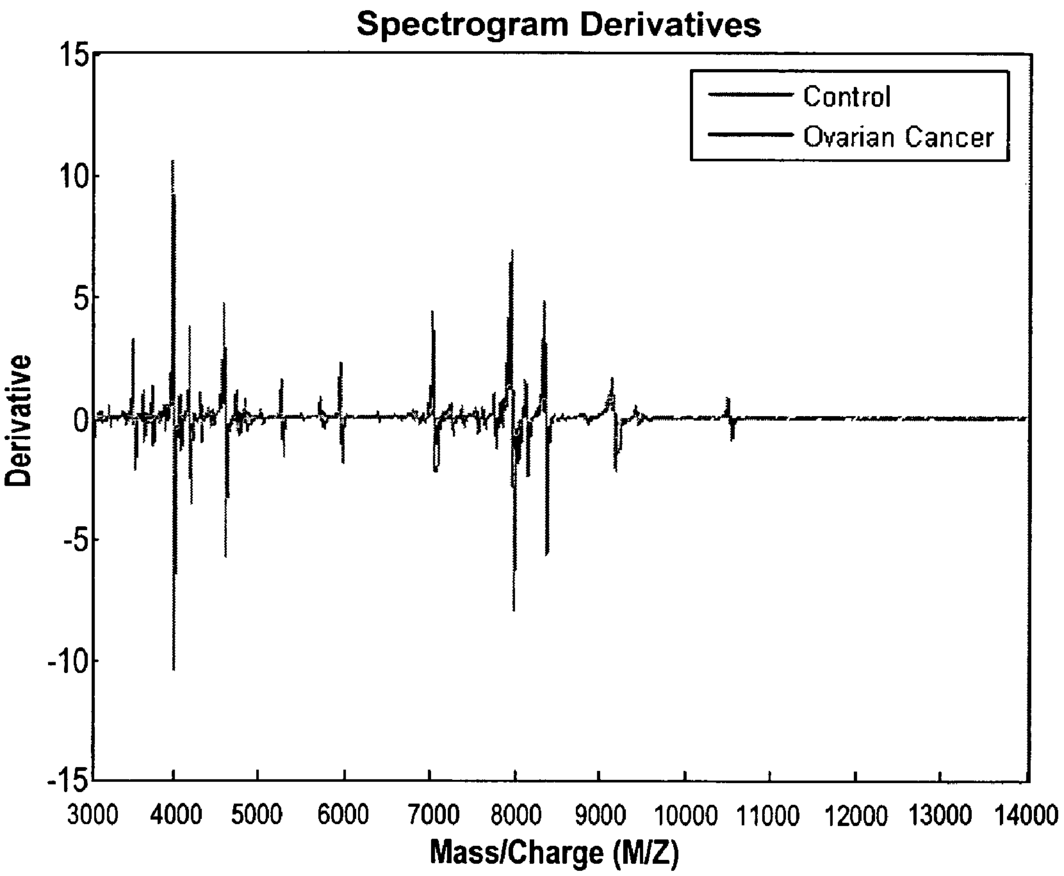

An illustrative example of the derivatives produced by the diff function is shown in the derivative spectrogram of FIG. 5J. The derivatives of the mass spectra data set can be used to train and classify mass spectra data samples in accordance with practicing the present invention as described in conjunction with illustrative method 200.

The following example illustrates the classification techniques of the present invention using a K-nearest neighbor classifier 320:

```
cp__1=classperf(grp);
cp__2=classperf(grp);
for j=1:10% crossvalidation run 10 times
% Select random training and test sets for 50% hold-out crossvalidation
[train,test]=crossvalind('holdout',grp,0.5,'classes',
    {'Normal','Cancer'});
% classify with KNN
c_1=knnclassify(YR(:,test)',YR(:,train)',grp(train),3,
    'corr');
c_2=knnclassify(YD(:,test)',YD(:,train)',grp(train),3,
'corr');
% Compute performance for current crossvalidation
classperf(cp__1,c__1,test);
classperf(cp__2,c__2,test);
end
disp(sprintf('KNN Classifier without Derivative, Correct Class Average:
%.4f',cp__1.CorrectRate))
disp(sprintf('KNN Classifier with Derivative, Correct Class Average:
%.4f',cp__2.CorrectRate))
```

© The MathWorks, Inc.

In the above example, the classperm function 312 is a function available in the technical computing environment 120 of MATLAB® to evaluate the performance of a classifier 320. The clasperm function 312 provides an interface to keep track of the performance during the validation of classifiers 320. The classifier 320 trained with derivative-based mass spectra data set 240 provides the following classification performance:

KNN Classifier without Derivative, Correct Class Average: 0.9071

KNN Classifier with Derivative, Correct Class Average: 0.9817

As is shown by the above output, the nearest neighbor classifier 320 trained with the derivative-based mass spectra data set 340 is more accurate in comparison to the nearest neighbor classifier 320 trained with a non-derivative-based mass spectra data set 330.

In another example, the following program 340 shows an illustrative example of using the classification techniques of the present invention with a PCA/LDA type classifier 320:

```
cp__1=classperf(grp);
cp__2=classperf(grp);
for j=1:10% crossvalidation run 10 times
% Select random training and test sets for 50% hold-out
    crossvalidation
[train,test]=crossvalind('holdout',grp,0.5,'classes',
    {'Normal','Cancer'});
% select only the significant features based on ttest
feats=sort(sqtlfeatures(YD(:,train),Nidx(train),'Num',
    2000));
% PCA to reduce dimensionality
    P1=princomp(YR(feats,train)','econ');
P2=princomp(YD(feats,train)','econ');
% Project into PCA space
x1=YR(feats,:)'*P1(:,1:sum(train)-2);
x2=YD(feats,:)'*P2(:,1:sum(train)-2);
% Use linear classifier
c__1=classify(x1(test,),x1 (train,:),grp(train));
c__2=classify(x2(test,:),x2(train,:),grp(train));
% Compute performance for current crossvalidation
classperf(cp__1,c__1,test);
classperf(cp__2,c__2,test);
end
disp(sprintf('PCA/LDA Classifier without Derivative, Correct Class Average:
%.4f',cp__1.CorrectRate))
disp(sprintf('PCA/LDA Classifier with Derivative, Correct Class Average:
%.4f',cp__2.CorrectRate))
```

© The MathWorks, Inc.

The classification verification output from executing the above illustrative program 340 in the computing environment 310 is as follows:

PCA/LDA Classifier without Derivative, Correct Class Average: 0.9976

PCA/LDA Classifier with Derivative, Correct Class Average: 0.9968

In this case, the classifier 320 trained with and without the derivative-based mass spectra data set 340 performed comparably. However, the mass spectra data set 330 used in the above examples comprise low resolution mass spectra data 330. As will be shown by the following example, the PCA/LDA type classifier 320 trained with the classification techniques of the present invention performs better when using higher resolution mass spectra data 330.

In conjunction with FIGS. 6A and 6B, another illustrative example of the present invention will be discussed using high resolution data of the Ovarian Dataset 8-7-02 from the Clinical Proteomics Program Databank. The following executable instructions of an illustrative program 340 loads the high resolution mass spectra data 330:

```
clear all
load OvarianCancerQAQCdataset
N=213; % Number of samples
lbls={'Cancer','Normal'}; % Group labels
grp=lbls([ones(120,1);ones(93,1)+1]); % Ground truth
Cidx=strcmp('Cancer',grp); % Logical index vector for Cancer samples
Nidx=strcmp('Normal',grp); % Logical index vector for Normal
samples
```

xAxisLabel='Mass/Charge (M/Z)'; % x label for plots
yAxisLabel='Ion Intensity'; %

© The MathWorks, Inc.

This high resolution mass spectra data 330 can be preprocessed in accordance with any of the steps 205*a*–205*n* of illustrative method 200. In one embodiment, the mass spectra data set 330 of this example was preprocessed in a similar manner as the previous example discussed in conjunction with FIGS. 5A–5H.

Figure 6A:
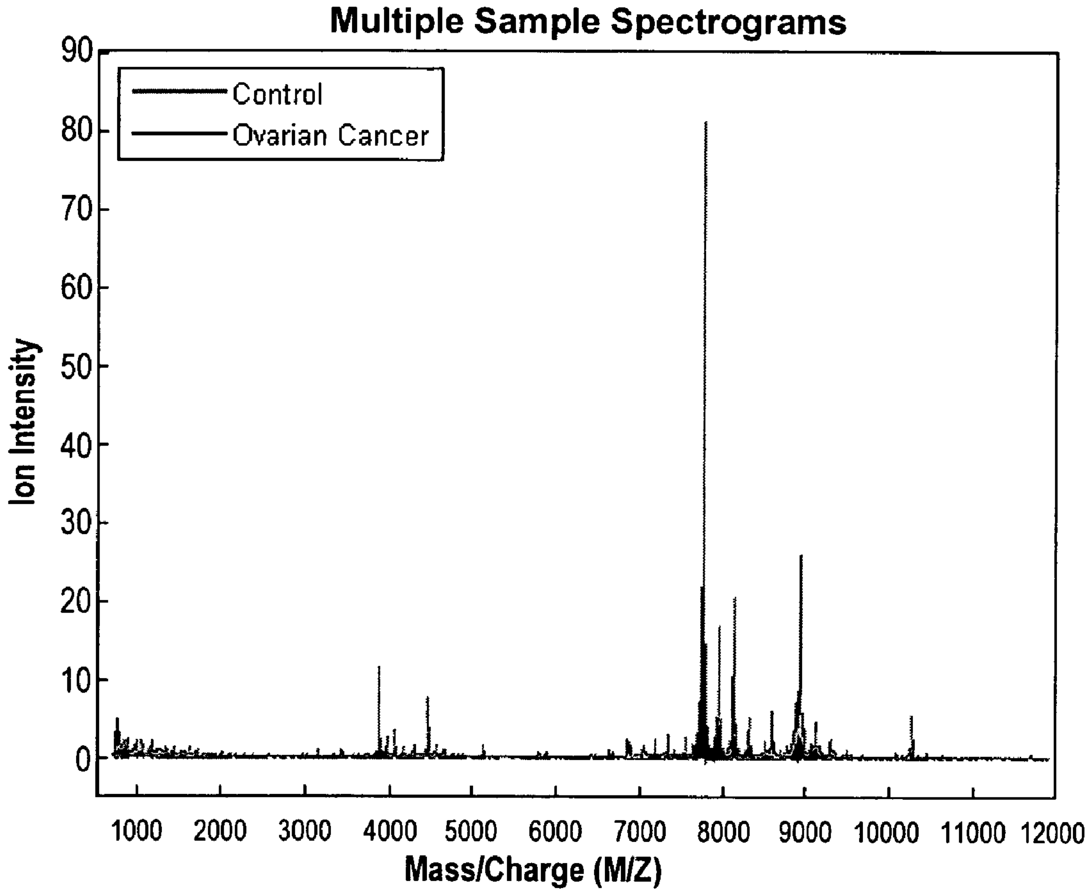
FIGS. 6A–6B depict various graphical plots of high-resolution mass spectra data sets used as illustrative examples in practicing another illustrative embodiment of the present invention.

Some data sets of the high resolution mass spectra data set 330 may be plotted as shown in FIG. 6A to visually compare the profiles from the two groups of cancer patients and control patients:

```
figure; hold on;
hC=plot(MZ,Y(:,1:5),'b');
hN=plot(MZ,Y(:,121:125),'g');
xlabel(xAxisLabel); ylabel(yAxisLabel);
axis([500 12000−5 90])
legend([hN(1),hC(1)], {'Control','Ovarian Cancer'},2)
title('Multiple Sample Spectrograms')
```

© The MathWorks, Inc.

As may be seen in FIG. 6A, the region from 8,500 to 8,700 m/z shows some peaks that might be useful for classification. The data can be plotted as depicted in the illustrative graph of FIG. 6B to show the peaks in the 8,450 to 8,700 m/z range by executing the following instruction:

```
axis([8450,8700,−1,7])
```

Figure 6B:
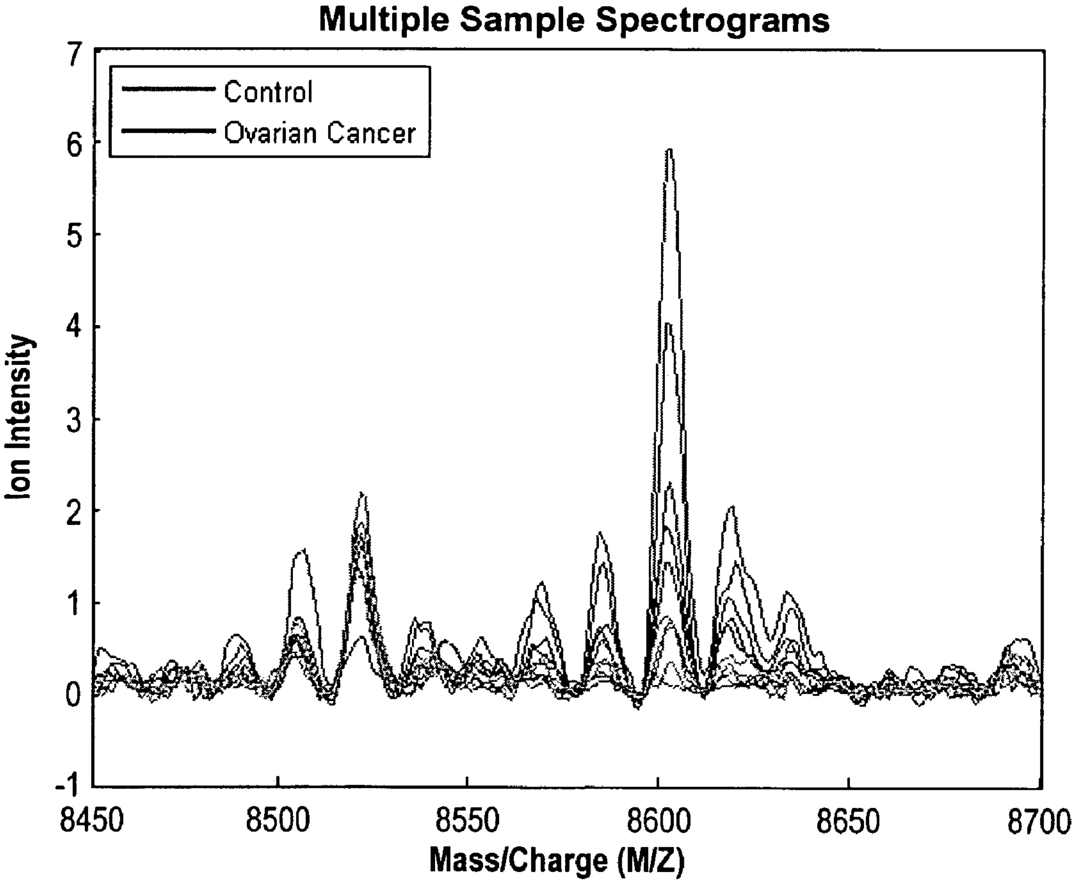

FIG. 6B shows that there are several interesting peaks in this range that may be useful for classification.

In accordance with one embodiment of the present invention, a derivative is taken on the high resolution mass spectra data set 330 to from a training mass spectra data set 340 for training a classifier 320. The following program 340 performs the derivative function 324 in accordance with step 215*a* of the illustrative method 200:

% Resample the signal to an uniformly spaced MZ vector and the take the derivative [MZR,YR]=msresample(MZ,Y, 1000,'Uniform',true);

```
YD=diff(YR);
```

© The MathWorks, Inc.

This provides a derivative-based mass spectra data set 340 to train a classifier 320 using the techniques of the present invention.

The following example illustrates the classification techniques of the present invention using a K-nearest neighbor classifier 320 with derivatives of high resolution mass spectra data 340:

```
cp__1=classperf(grp);
cp__2=classperf(grp);
for j=1:10% crossvalidation run 10 times
% Select random training and test sets for 50% hold-out
    crossvalidation
[train,test]=crossvalind('holdout',grp,0.5,'classes',
    {'Normal','Cancer'});
% classify with KNN
c__1=knnclassify(YR(:,test)',YR(:,train)',grp(train),3,
    'corr');
c__2=knnclassify(YD(:,test)',YD(:,train)',grp(train),3,
    'corr');
% Compute performance for current crossvalidation
classperf(cp__1,c__1,test);
classperf(cp__2,c__2,test);
end
disp(sprintf('KNN Classifier without Derivative, Correct
Class Average:
%.4f',cp__1.CorrectRate))
disp(sprintf('KNN Classifier with Derivative, Correct
Class Average:
%.4f',cp__2.CorrectRate))
```

© The MathWorks, Inc.

The classification verification output from executing the above illustrative program 340 in the computing environment 310 is as follows:

KNN Classifier without Derivative, Correct Class Average: 0.9019

KNN Classifier with Derivative, Correct Class Average: 0.9274

By the above output, the nearest neighbor type classifier 320 also performed more accurately with the high-resolution mass spectra data as compared with the classification of the low resolution mass spectra data.

In another example, the following program 340 shows an illustrative example of using the classification techniques of the present invention with a linear discriminant analysis type classifier 320, such as a PCA/LDA classifier:

```
cp__1=classperf(grp);
cp__2=classperf(grp);
for j=1:10% crossvalidation run 10 times
% Select random training and test sets for 50% hold-out
    crossvalidation
[train,test]=crossvalind('holdout',grp,0.5,'classes',
    {'Normal','Cancer'});
% select only the significant features based on ttest
feats=sort(sqtlfeatures(YD(:,train),Nidx(train),'Num',
    500));
% PCA to reduce dimensionality
P1=princomp(YR(feats,train)','econ');
P2=princomp(YD(feats,train)','econ');
% Project into PCA space
x1=YR(feats,:)'*P1(:,1:sum(train)−2);
x2=YD(feats,:)'*P2(:,1:sum(train)−2);
% Use linear classifier
c__1=classify(x1(test,:),x1 (train,:),grp(train));
c__2=classify(x2(test,:),x2(train,:),grp(train));
% Compute performance for current crossvalidation
classperf(cp__1,c__1,test);
classperf(cp__2,c__2,test);
end
disp(sprintf('PCA/LDA Classifier without Derivative,
Correct Class Average:
%.4f',cp__1.CorrectRate))
disp(sprintf('PCA/LDA Classifier with Derivative, Correct Class Average:
%.4f',cp__2.CorrectRate))
```

© The MathWorks, Inc.

The classification verification output from executing the above illustrative program 340 in the computing environment 310 is as follows:

PCA/LDA Classifier without Derivative, Correct Class Average: 0.9632

PCA/LDA Classifier with Derivative, Correct Class Average: 0.9821

The PCA/LDA classifier 320 trained with a derivative-based high resolution mass spectra data 340 performed more accurately than the low resolution data example described with FIGS. 5A–5J. As shown by these various examples in relation to FIG. 4 through FIG. 6, the techniques of the present invention provide a more accurate and sensitive classification system.

Figure 3B:
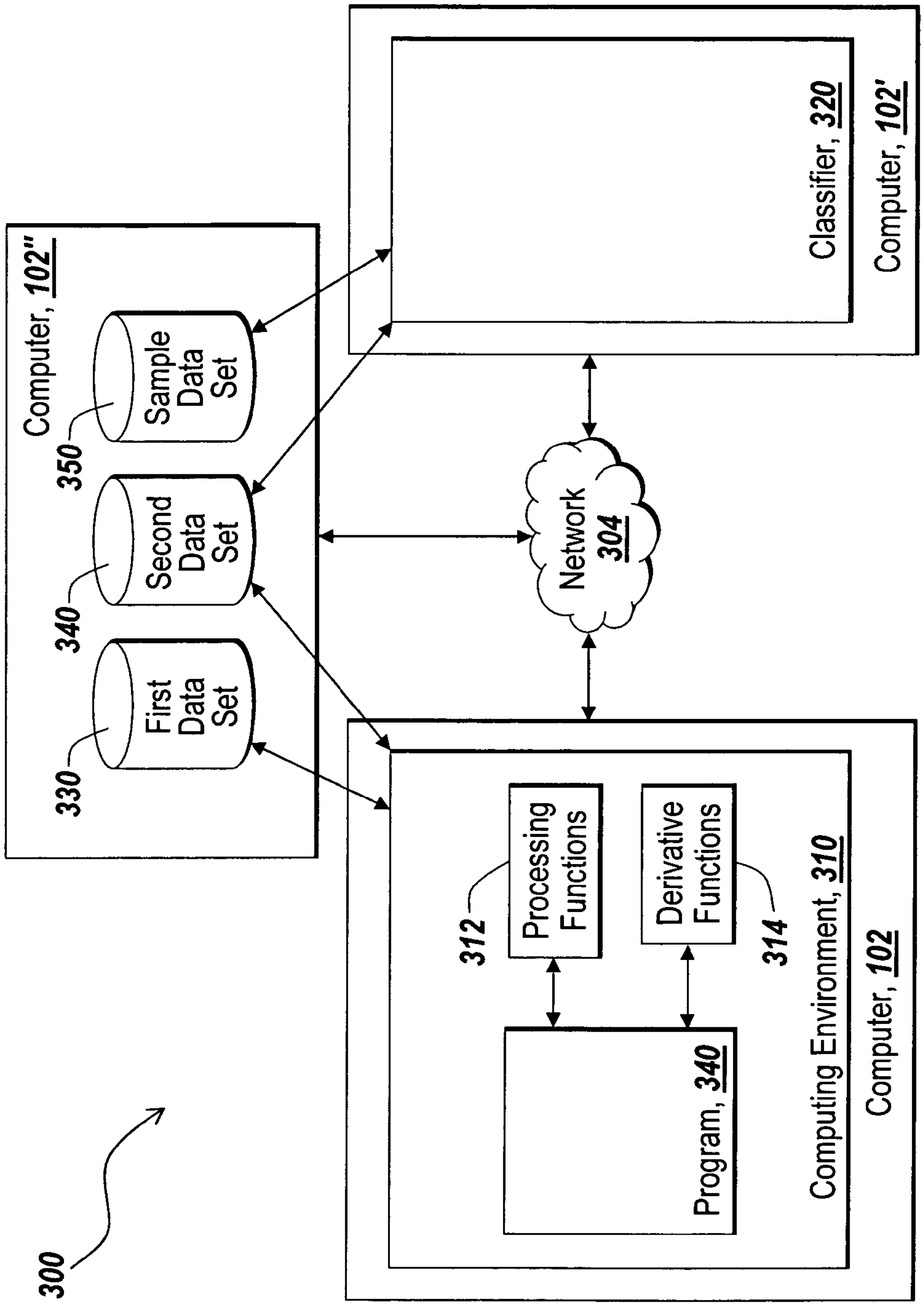
FIG. 3B is a block diagram of another illustrative embodiment of components of a networked system for practicing the present invention.

In other embodiments, any of the mass spectra data sets 330, 340, 350 and any of the components, e.g., derivative functions 314, classifier 320, and processing functions 312 of the computing environment 310 may be distributed across multiple computing devices 102. FIG. 3B depicts another environment suitable for practicing an illustrative embodiment of the present invention, where the computing environment 310 and the classifier 320 are deployed in a networked computer system 300. In a broad overview, the networked system 300 is a multiple node network 304 for running in a distributed manner the computing environment 310 and the classifier 320 of the present invention. The networked system 300 includes multiple computers 102, 102' and 102" connected to, and communicating over a network 304. The network 304 can be a local area network (LAN), such as a company Intranet, a metropolitan area network (MAN), or a wide area network (WAN) such as the Internet. In one embodiment (not shown), the network 304 comprises separate networks, which may be of the same type or may be of different types. The topology of the network 304 over which the computers 102, 102', 102" communicate may be a bus, star, or ring network topology. The network 304 and network topology may be of any such network 304 or network topology capable of supporting the operations of the present invention described herein.

The computers 102, 102' and 102" can connect to the network 304 through a variety of connections including standard telephone lines, LAN or WAN links (e.g., T1, T3, 56 kb, X.25, SNA, DECNET), broadband connections (ISDN, Frame Relay, ATM, Gigabit Ethernet, Ethernet-over-SONET), cluster interconnections (Myrinet), peripheral component interconnections (PCI, PCI-X), and wireless connections, or some combination of any or all of the above. Connections can be established using a variety of communication protocols (e.g., TCP/IP, IPX, SPX, NetBIOS, Ethernet, ARCNET, Fiber Distributed Data Interface (FDDI), RS232, IEEE 802.11, IEEE 802.11a, IEEE 802.11b, IEEE 802.11g, and direct asynchronous connections). The network connection and communication protocol may be of any such network connection or communication protocol capable of supporting the operations of the present invention described herein.

In the network 304, each of the computers 102 are configured to and capable of running at least a portion of the present invention. As a distributed application, the present invention may have one or more software components that run on each of the computers 102–102" and work in communication and in collaboration with each other to meet the functionality of the overall application as described herein. Each of the computers 102 can be any type of computing device as described above and respectively configured to be capable of computing and communicating the operations described herein. For example, any and each of the computers 102 may be a server, a multi-user server, server farm or multi-processor server. In another example, any of the computers 102 may be a mobile computing device such as a notebook or PDA. One ordinarily skilled in the art will recognize the wide range of possible combinations of types of computing devices capable of communicating over a network 304.

The network 304 and network connections may comprise any transmission medium between any of the computers 102, such as electrical wiring or cabling, fiber optics, electromagnetic radiation or via any other form of transmission medium capable of supporting the operations of the present invention described herein. The methods and systems of the present invention may also be embodied in the form of computer data signals, program code, or any other type of transmission that is transmitted over the transmission medium, or via any other form of transmission, which may be received, loaded into, and executed, or otherwise processed and used by a computing device 102 to practice the present invention.

Each of the computers 102 may be configured to and capable of running computing environment 310 and/or the classifier 320. The computing environment 310 and the classifier 320 may run together on the same computer 102, or may run separately on different computers 102 and 102'. Furthermore, the computing environment 310 and/or the classifier 320 can be capable of and configured to operate on the operating system that may be running on any of the computers 102. Each computer 102 can be running the same or different operating systems. For example, computer 102 can be running Microsoft® Windows, and computer 102' can be running a version of UNIX, and computer 102", a version of Linux. Or each computer 102 can be running the same operating system, such as Microsoft® Windows. Additionally, the computing environment 310 and the classifier 320 can be capable of and configured to operate on and take advantage of different processors of any of the computing device. For example, the computing environment 310 can run on a 32 bit processor of one computing device 102 and a 64 bit processor of another computing device 102'. Furthermore, the computing environment 310 and/or classifier 320 can operate on computing devices 102 that can be running on different processor architectures in addition to different operating systems. One ordinarily skilled in the art will recognize the various combinations of operating systems and processors that can be running on any of the computing devices 102. One ordinarily skilled in the art will further appreciate the computing environment 310 and/or the classifier 320, and any components or portions thereof, may be distributed and deployed across a wide range of different computing devices, different operating systems and different processors in various network topologies and configurations.

Still referring to FIG. 3B, any of the computers 102 may also be a computing device embedded in or in communication with any type of mass spectrometry equipment. As such, the mass spectrometry equipment may practice any portion or all of the operations of the systems and methods of the present invention described herein. For example, any first mass spectra data sets 330, raw or preprocessed, the second mass spectra data sets 340 for training, or any sample mass spectra data sets 350 may be obtained or provided, automatically or otherwise, between the mass spectrometry equipment and any other computers 102. The mass spectrometry equipment may perform any of the preprocessing to the first mass spectra data set 330 to form a second mass spectra data set 340 using any of the techniques in connection with the methods of FIGS. 2A–2C. Additionally, the single computer embodiment depicted in FIG. 3A may be embedded in or in communication with any type of mass spectrometry equipment to provide a single integrated solution for mass spectrum classification using the techniques of the present invention. One ordinarily skilled in the art will appreciate the various ways the present invention may be practiced in communication with or embedded in mass spectrometry equipment.

In view of the structure, functions and operations of the computing environment 310 and classifier 320 as described herein, the present invention provides for techniques to improve finding differentiable features and potential markers in the patterns and characteristics of mass spectra data. Using derivatives of mass spectrum signals, or high-pass filtered signals, proves to expose and emphasize other interesting features of mass spectra patterns that may have otherwise not been differentiable. Furthermore, training classifiers with derivatives of mass spectrum signals provides for more accurate, sensitive, and more specific classification. This may lead to the discovery of new and novel potential markers, which is especially useful in the diagnostics of biological states and conditions, such as the early detection of diseases. Once markers are discovered they can be used to provide diagnostic tools. Finding markers that detect diseases is a challenging step in the process of diagnosing and discovering drugs for diseases. Additionally, the research investment in disease diagnostics can be costly in time and resources. However, to those finding novel markers for disease detection, such as a major disease, the return from the research investment can be significantly rewarding, financially and otherwise. Using the approach of the present invention will increase the quality of mass spectra classification while reducing the time and cost of classifying mass spectra samples. Moreover, it may reduce or facilitate the reduction of research investment to discover new disease markers.

Many alterations and modifications may be made by those having ordinary skill in the art without departing from the spirit and scope of the invention. Therefore, it must be expressly understood that the illustrated embodiments have been shown only for the purposes of example and should not be taken as limiting the invention, which is defined by the following claims. These claims are to be read as including what they set forth literally and also those equivalent elements which are insubstantially different, even though not identical in other respects to what is shown and described in the above illustrations.

What is claimed is:

1. In an electronic device, a method for classifying mass spectra, the method comprising the steps of:

filtering one or more mass spectrum signals of a first data set of mass spectrum signals with a high-pass filter to form a second data set; and providing the second data set to train a classifier for mass spectrometry classification, the second data set comprising one or more mass spectrum signals passed through the high-pass filter, wherein one of the first data set or the second data set further comprises data corresponding to a mathematical derivative of mass spectrum data.

2. The method of claim 1, comprising invoking an execution of the classifier to train with the second data set.

3. The method of claim 1, wherein the classifier comprises one of a linear discriminant analysis classifier and a nearest neighbor classifier.

4. The method of claim 1, comprising invoking an execution of the classifier trained with the second data set to classify a sample data set of mass spectrum signals.

5. The method of claim 4, wherein the sample data set comprises one or more mass spectrum signals passed through a high-pass filter.

6. The method of claim 1, comprising obtaining a plurality of raw mass spectrum intensity signals to form a portion of the first data set.

7. The method of claim 1, comprising obtaining a plurality of processed mass spectrum intensity signals to form a portion of the first data set.

8. The method of claim 7, wherein one or more of the plurality of processed mass spectrum intensity signals has been one of normalized, smoothed, case corrected, baseline corrected, and peak aligned.

9. The method of claim 1, wherein the classifier comprises a classifier function in a technical computing environment.

10. The method of claim 1, wherein filtering comprises invoking execution of executable instructions in a technical computing environment.

11. The method of claim 1, wherein the high-pass filter comprises a mechanism to calculate the difference between adjacent mass spectra intensity signal values of the first mass spectra data set having non-uniformly spaced data.

12. A device readable medium holding device readable instructions for a method for classifying mass spectra, the method comprising the steps of:

filtering one or more mass spectrum signals of a first data set of mass spectrum signals with a high-pass filter to form a second data set; and providing the second data set to train a classifier for mass spectrometry classification, the second data set comprising one or more mass spectrum signals passed through the high-pass filter, wherein one of the first data set or the second data set further comprises data corresponding to a mathematical derivative of mass spectrum data.

13. The medium of claim 12, comprising invoking an execution of the classifier to train with the second data set.

14. The medium of claim 12, wherein the classifier comprises one of a linear discriminant analysis classifier and a nearest neighbor classifier.

15. The medium of claim 12, comprising invoking an execution of the classifier trained with the second data set to classify a sample data set of mass spectrum signals.

16. The medium of claim 15, wherein the sample data set comprises one or more mass spectrum signals passed through a high-pass filter.

17. The medium of claim 12, comprising obtaining a plurality of raw mass spectrum intensity signals to form a portion of the first data set.

18. The medium of claim 12, comprising obtaining a plurality of processed mass spectrum intensity signals to form a portion of the first data set.

19. The medium of claim 18, wherein one or more of the plurality of processed mass spectrum intensity signals has been one of normalized, smoothed, case corrected, baseline corrected, and peak aligned.

20. The medium of claim 12, wherein the classifier comprises a classifier function in a technical computing environment.

21. The medium of claim 12, wherein filtering comprises invoking execution of executable instructions in a technical computing environment.

22. The medium of claim 12, wherein the high-pass filter comprises a mechanism to calculate the difference between adjacent mass spectra intensity signal values of the first mass spectra data set having non-uniformly spaced data.

23. A distribution system for transmitting via a transmission medium computer data signals representing device readable instructions for a method of classifying mass spectra, the method comprising the steps of:

filtering one or more mass spectrum signals of a first data set of mass spectrum signals with a high-pass filter to form a second data set; and providing the second data set to train a classifier for mass spectrometry classification, the second data set comprising one or more mass spectrum signals passed through the high-pass filter, wherein one of the first data set or the second data set further comprises data corresponding to a mathematical derivative of mass spectrum data.

* * * * *